(12) United States Patent
Tokairin

(10) Patent No.: US 8,415,983 B2
(45) Date of Patent: Apr. 9, 2013

(54) DIGITAL PHASE COMPARATOR

(75) Inventor: Takashi Tokairin, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/203,138

(22) PCT Filed: Mar. 5, 2010

(86) PCT No.: PCT/JP2010/054166
§ 371 (c)(1),
(2), (4) Date: Aug. 24, 2011

(87) PCT Pub. No.: WO2010/104164
PCT Pub. Date: Sep. 16, 2010

(65) Prior Publication Data
US 2011/0304357 A1 Dec. 15, 2011

(30) Foreign Application Priority Data

Mar. 10, 2009 (JP) ................... 2009-056886
Aug. 19, 2009 (JP) ................... 2009-190425

(51) Int. Cl.
*G01R 25/00* (2006.01)
(52) U.S. Cl. .............. 327/12; 327/3; 327/7; 327/2
(58) Field of Classification Search ........... 327/2, 3, 327/12, 7
See application file for complete search history.

(56) References Cited

U.S. PATENT DOCUMENTS

| 6,288,574 | B1 * | 9/2001 | Neary ............... 327/12 |
| 6,429,693 | B1 * | 8/2002 | Staszewski et al. ....... 327/12 |
| 7,304,510 | B2 * | 12/2007 | Matsuta ................ 327/3 |
| 7,755,397 | B2 * | 7/2010 | El-Kik ................ 327/12 |
| 2007/0085570 | A1 | 4/2007 | Matsuta |

FOREIGN PATENT DOCUMENTS

| JP | 2002-076886 A | 3/2002 |
| JP | 2004-061339 A | 2/2004 |
| JP | 2007-110370 A | 4/2007 |

* cited by examiner

*Primary Examiner* — Hai L Nguyen
(74) *Attorney, Agent, or Firm* — Sughrue Mion, PLLC

(57) ABSTRACT

A digital phase comparator is provided in which first phase difference signals and second phase difference signals are used as digital phase difference information. The first phase difference signals are generated by sampling a second clock signal with a first group of clock signals having regular intervals. The second phase difference signals are generated, using a second group of clock signals and a first group of signals which are obtained by delaying a second clock signal and a first signal generated by performing a logic operation on the first phase difference signal respectively at different regular intervals, by sampling the second group of clock signals with the first group of signals.

20 Claims, 24 Drawing Sheets

DIGITAL PHASE COMPARATOR

CROSS REFERENCE TO RELATED APPLICATIONS

This application is a National Stage of International Application No. PCT/JP2010/054166, filed on Mar. 5, 2010, which claims priority from Japanese Patent Application Nos. 2009-056886, filed on Mar. 10, 2009 and JP 2009-190425, filed on Aug. 19, 2009, the contents of all of which are incorporated herein by reference in their entirety.

TECHNICAL FIELD

This invention relates to a phase comparator, in particular to a digital phase comparator for detecting a phase difference to convert it to a digital signal.

BACKGROUND ART

Recently, in the field of LSIs (Large Scale Integrated circuits) for wireless communication to which a fine CMOS (Complementary MOS (Metal-Oxide-Semiconductor)) process is applied, the degree of integration has been increased. In conventional LSIs for wireless communication, an analog PLL circuit is usually employed as a PLL (Phase Locked Loop) circuit.

In the case of an analog PLL circuit, phase difference information is produced by a phase comparator (PD) as a pulse width, and electrical charge that is produced by a charging pump circuit (CP) according to the pulse width is converted into voltage information by a loop filter. Oscillating frequency is controlled by supplying the voltage information from the loop filter into a control voltage terminal of a VCO (Voltage Controlled Oscillator). Such an analog PLL cannot gain such benefits as size reduction or cost reduction as a result of miniaturization of the circuit because it uses elements such as resistances and capacitances in its loop filter or the like. Moreover, the voltage is lowered by the miniaturization, which poses a problem of deterioration in characteristics due to source noise or the like.

In recent years, on the other hand, researches and developments of fully digital PLL circuits have been conducted for configuring the PLL circuits in digital fashion. In a fully digital PLL circuit, frequency is controlled by digitally switching a micro varactor in order to control a VCO. Therefore, instead of a phase comparator producing phase difference information as a pulse width used by a conventional analog PLL, a digital phase comparator is required which produces phase difference information as a digital value.

One of known configurations of such digital phase comparators is shown in FIG. 1 (Patent Document 1: JP 2002-076886A). FIG. 2 is a timing chart for explaining operation of the circuit of FIG. 1. An output signal CLK1 of a VCO is sequentially delayed by a cascade-connected inverter array, and output signals of respective inverters of the inverter array are latched by flip-flops using a reference clock signal CLK2 as a clock, whereby a digital phase comparator is realized, which produces a phase difference as a digital value. When the output signals of the respective inverters of the inverter array are sampled at the rising edge of the reference clock signal CLK2, comparison results of $Q_C(1)$ to $Q_C(8)$ ($Q_C(1:8)$ in FIG. 2) are obtained. A logic circuit detects a logic change of $Q_C(1)$ to $Q_C(8)$ to produce a digital code.

Another known configuration of a digital phase comparator is shown in FIG. 3 (Patent Document 2: JP 2007-110370A). According to the configuration of FIG. 3, not only an output signal CLK1 from a VCO is sequentially delayed by a first inverter array, but also a reference clock signal CLK2 is sequentially delayed by a second inverter array, and these signals are latched by flip-flops. Outputs $D_F(1)$, $D_F(2)$, ... $D_F(n)$ from the respective inverters of the first inverter array are sampled with the flip-flops by using the edges of outputs $CK_F(1)$, $CK_F(2)$, ... $CK_F(n)$ from the respective inverters of the second inverter array (using the rising edges for odd-numbered inverters such as first and third inverters, and using the falling edges for even-numbered inverters such as second and fourth inverters), whereby $Q_F(1)$, $Q_F(2)$, ... $Q_F(n)$ are produced. As shown in a timing chart of FIG. 4, phase comparison is conducted in terms of resolution of delay time difference between the first inverter array and the second inverter array. A logic circuit detects a logic change of $Q_F(1)$ to $Q_F(8)$ (the logic change of $Q_F(1)$ to $Q_F(3)$ is zero, and the logic change of $Q_F(4)$ to $Q_F(8)$ is one), and produces a digital code.

DISCLOSURE OF INVENTION

Problems to be Solved by the Invention

The aforementioned digital phase comparators have problems as described below. According to the configuration shown in FIG. 1, a signal supplied to the inverter array is a high-speed signal produced by the VCO. Therefore, the power consumption in the inverter array is increased. Since the time resolution of the detected phase difference is determined by delay time of each inverter, the inverter delay must be decreased substantially in order to improve the resolution. This induces problems such as increased power consumption or insufficient resolution when the signal frequency of the VCO is high. According to the configuration of FIG. 3, problems arise in order to cover a desired range of phase differences. For example, the number of inverters in the inverter array and the number of flip-flops are increased, resulting in increase in circuit area and power consumption.

This invention has been made in order to solve the aforementioned problems, and it is an object of the invention to provide a high-resolution digital phase comparator without causing increase of circuit area or power consumption, and a phase difference detection method for such comparator.

Means for Solving the Problems

An aspect of this invention provides a digital phase comparator including: a first circuit unit having a first delay element array for delaying a first clock signal at regular intervals, and a first group of data holding circuits for generating and producing first phase difference signals obtained by sampling a second clock signal with the use of the first clock signal and a first group of delayed signals obtained by delaying the first clock signal with the first delay element array; a second circuit unit for generating a first signal by performing a logic operation on the first phase difference signals; and a third circuit unit having a second delay element array for delaying the second clock signal at first regular intervals, and a third delay element array for delaying the first signal at second regular intervals, and having a second group of data holding circuits for generating and producing second phase difference signals obtained by sampling a second group of delayed signals obtained by delaying the second clock signal with the second delay element array, with the uses of a third group of delayed signals obtained by delaying the first signal with the third delay element array, and the first phase difference signals and the second phase difference signals are digital phase difference information indicating a phase difference between the first clock signal an the second clock signal.

Another aspect of this invention provides a method of detecting a phase difference in a digital phase comparator, including the steps of: sampling a second clock signal with the use of a first group of clock signals obtained by delaying a first clock signal at regular intervals and the first clock signal, and holding the sampled signals as first phase difference signal in a first group of data holding circuits; generating a first signal by performing a logic operation on the first phase difference signals; and delaying the second clock signal and the first signal by different delay times from each other at regular intervals, sampling a second group of clock signals obtained by delaying the second clock signal at regular intervals with a first group of signals obtained by delaying the first signal at regular intervals, and holding the sampled signals as second phase difference signals in a second data holding circuit group.

Advantageous Effects of the Invention

This invention uses two different phase difference signals, namely first phase difference signals and second phase difference signals. The first phase difference signals are phase difference signals obtained by sampling a second clock signal using a first group of clock signals which are equally spaced. The second phase difference signals are generated based on a first clock signal and a first signal obtained by performing a logic operation on the first phase difference signals. The first phase difference signals cover a cycle period of the second clock signal. The second phase difference signals cover a resolution of the first phase difference signals, which makes it possible to reduce the circuit area and power consumption. The use of these two different phase difference signals makes it possible to provide a high-resolution digital phase comparator without causing increase in circuit area or power consumption.

BEST MODE FOR CARRYING OUT THE INVENTION

Exemplary embodiments of this invention will be described in detail with reference to the accompanying drawings.

(First Exemplary Embodiment)

Figure 1:
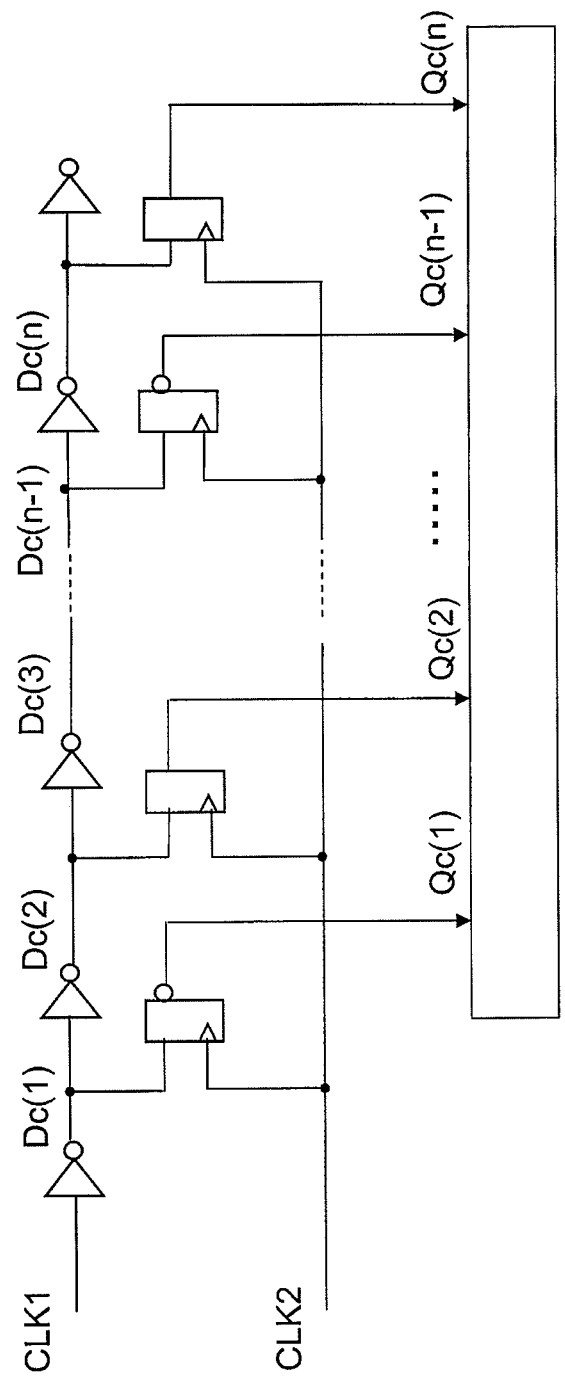
FIG. 1 is a diagram illustrating a configuration of a digital phase comparator according to a related art (Patent Document 1)
Figure 2:
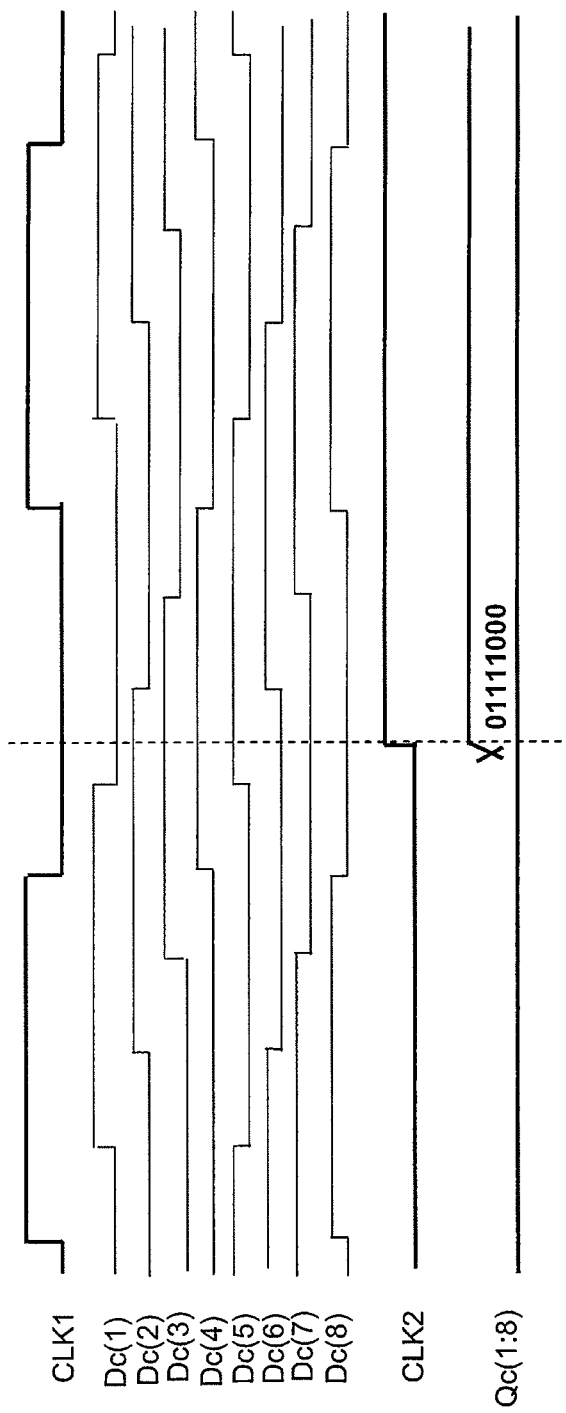
FIG. 2 is a timing chart for explaining an example of operation of the digital phase comparator according to the related art (Patent Document 1)
Figure 3:
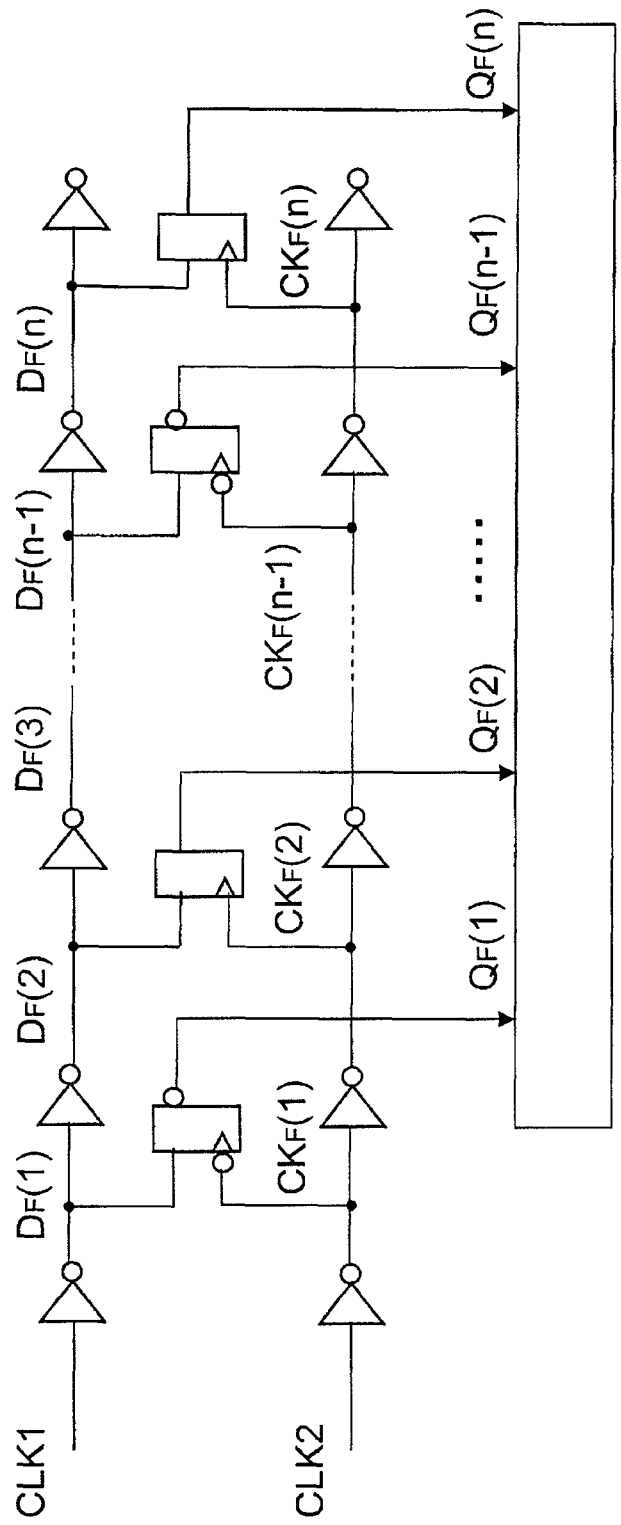
FIG. 3 is a diagram illustrating a configuration of a digital phase comparator according to another related art (Patent Document 2)
Figure 4:
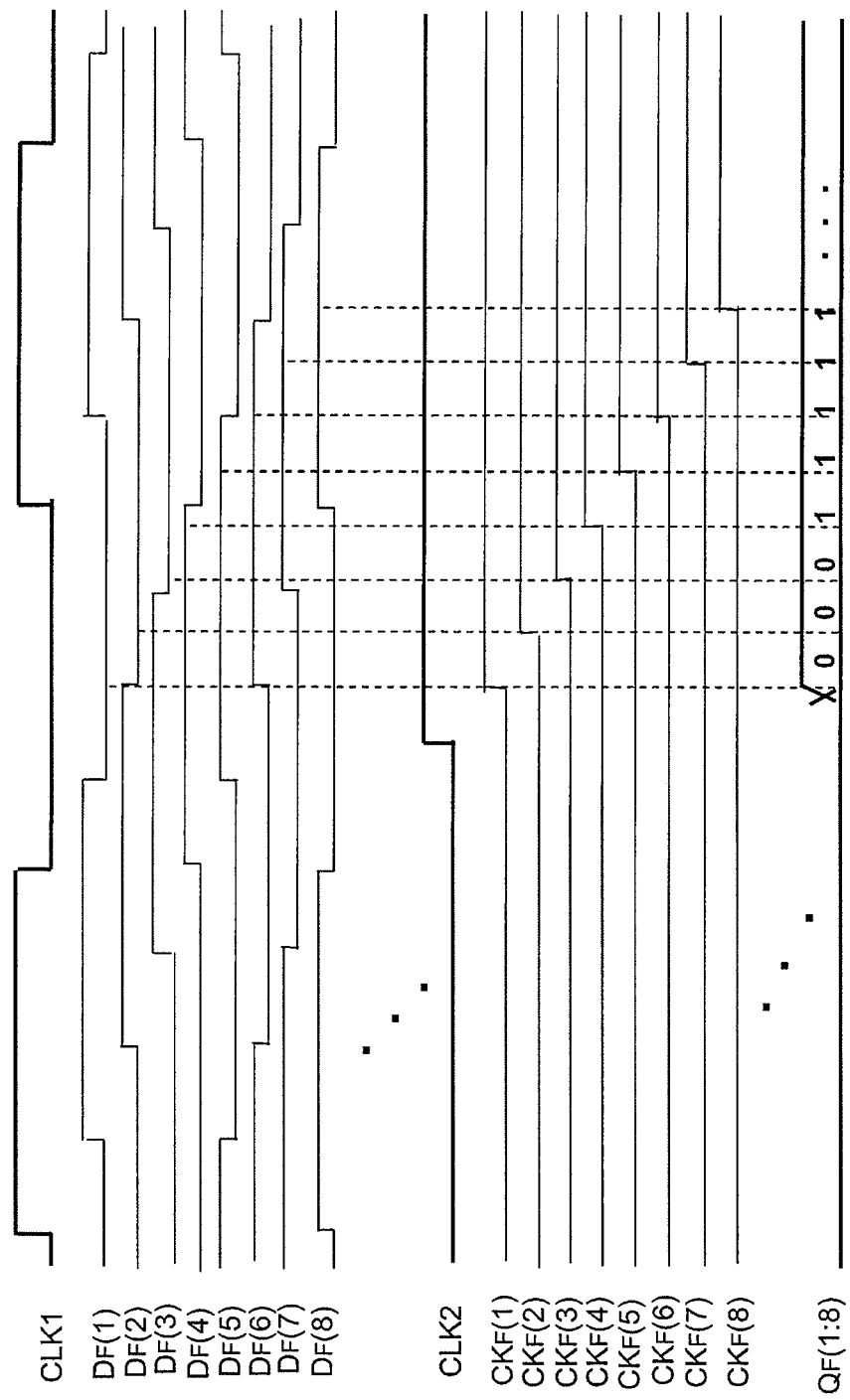
FIG. 4 is a timing chart for explaining an example of operation of the digital phase comparator according to the related art (Patent Document 2)
Figure 5:
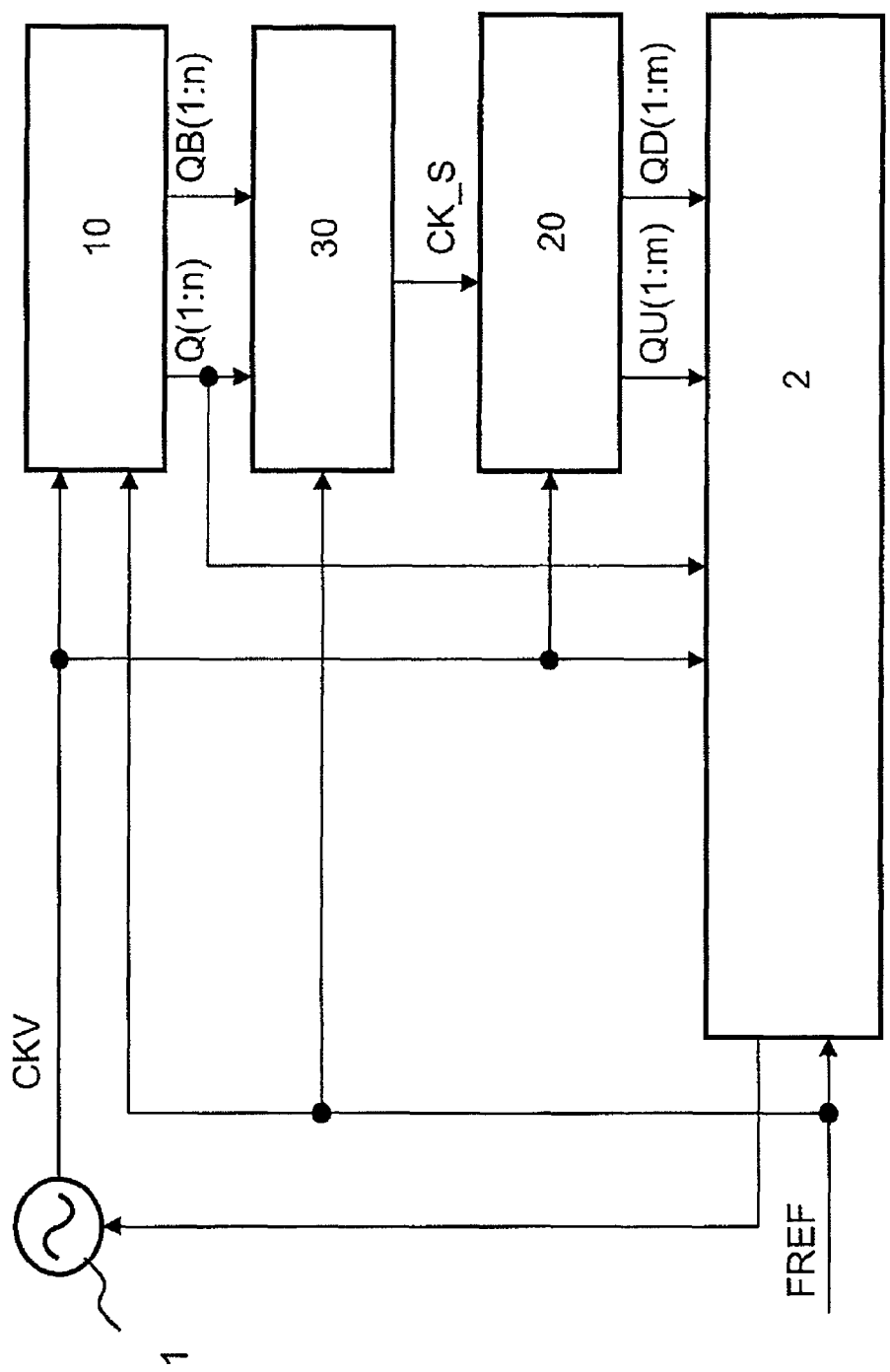
FIG. 5 is a diagram illustrating an overall configuration of a PLL circuit comprising a digital phase comparator according to this invention.

A first exemplary embodiment of this invention will be described in detail with reference to the drawings. FIG. 5 shows an overall configuration of a PLL circuit comprising a digital phase comparator according to the invention, and then FIG. 6 shows a block diagram of a configuration of a digital phase comparator according to a first exemplary embodiment of the invention.

The digital PLL circuit of this invention shown in FIG. 5 comprises a VCO (voltage-controlled oscillator) 1, a time-digital converter 10, a timing extractor 30, a time-digital converter 20, and a logic circuit 2. The time-digital converter 10, the timing extractor 30, and the time-digital converter 20 are collectively referred to as a digital phase comparator. Here, the description of this invention will be made in terms of detection of a phase difference of one cycle or less of the VCO and correction thereof. An output signal CKV from the VCO is supplied to the time-digital converter 10, the time-digital converter 20, and the logic circuit 2. The time-digital converter 10 is supplied with the output signal CKV from the VCO and with a reference clock signal FREF, and compares the phase difference therebetween to produce, as phase difference signals, positive logic phase difference signals Q(1:n) and negative logic phase difference signals QB(1:n). The positive logic phase difference signals Q(1:n) are supplied from the digital converter 10 to the timing extractor 30 and the logic circuit 2, while the negative logic phase difference signals QB(1:n) is supplied therefrom to the timing extractor 30.

Responsive to the phase difference signals Q(1:n) and QB(1:n) from the time-digital converter 10, the timing extractor 30 generates a pulse signal CK_S that is deviated from the VCO output signal CKV by an error less than a resolution of the time-digital converter 10 to supply it to the time-digital converter 20. The time-digital converter 20 is supplied with the VCO output signal CKV and the pulse signal CK_S slightly deviated from the VCO output signal CKV, and compares the phase differences therebetween to supply phase difference signals QU(1:m) and QD(1:m) to the logic circuit 2. The logic circuit 2 logically processes the phase difference signals Q(1:n) from the time-digital converter 10 and the phase difference signals QU(1:m), QD(1:m) from the time-digital converter 20 to correct the oscillating frequency of the VCO. Although the basic configuration of the digital PLL circuit is as illustrated in FIG. 5, modifications thereof are possible in which a modified signal of the VCO output signal CKV or the reference clock signal FREF may be used in place thereof as required.

Figure 6:
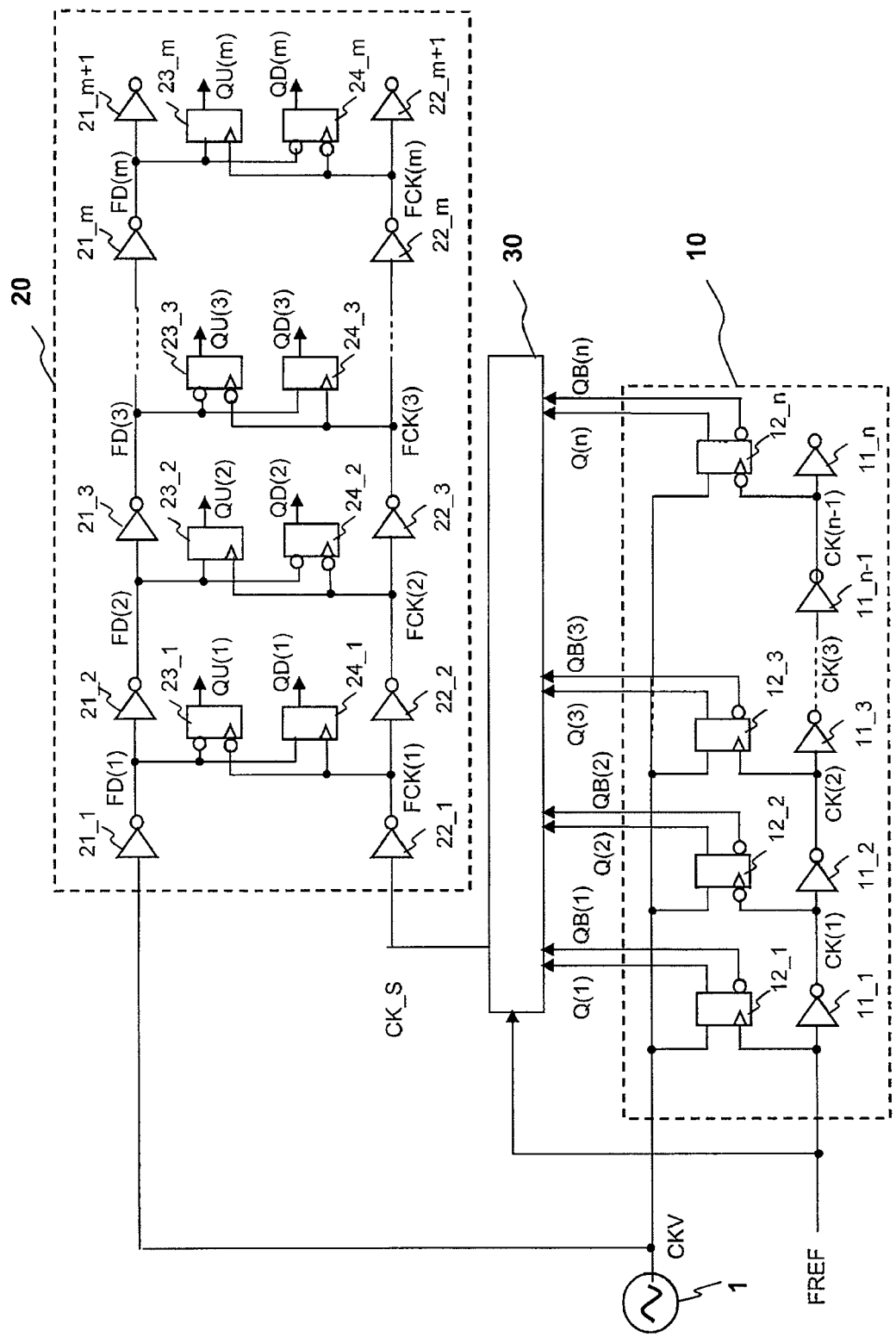
FIG. 6 is a diagram illustrating a configuration of a digital phase comparator according to a first exemplary embodiment of this invention.

Referring to FIG. 6, the digital phase comparator comprises the VCO 1, the time-digital converter 10 including an inverter array 11_1 to 11_n and flip-flops 12_1 to 12_n, the timing extractor 30, and the time-digital converter 20 including an inverter array 21_1 to 21_m+1, an inverter array 22_1 to 22_m+1, flip-flops 23_1 to 23_m, and flip-flops 24_1 to 24_m.

In the time-digital converter 10, the reference clock signal FREF is sequentially delayed by the inverter array 11_1 to 11_n. The reference clock signal FREF and output signals CK(1) to CK(n−1) from the inverter array 11_1 to 11_n−1 are respectively connected to clock terminals of the flip-flops 12_1 to 12_n. The output signal CKV supplied to data input terminals from the VCO 1 is latched at transition timings of the signals supplied to the clock terminals, and are produced as the phase difference signals Q(1) to Q(n) from the flip-flops 12_1 to 12_n. In this manner, the phase difference between the reference clock signal FREF and the VCO output signal CKV is converted into a digital signal at a resolution corresponding to a delay time accuracy of the inverter array 11_1 to 11_n, and it is supplied from the flip-flops to the timing extractor 30 as the phase difference signals Q(1) to Q(n). In order to match the logic for data latching, the odd-number flip-flops of the flip-flops 12_1 to 12_n are supplied with inputs in positive logic at their clock terminals, whereas the even-numbered flip-flops thereof are supplied with inputs in negative logic at their clock terminals. Specifically, the odd-numbered flip-flops 12_1, 12_3, . . . latch the reference clock signal FREF and its delayed signals (outputs from the inverter 11_2 . . . ) at their rising edges thereof, whereas the even-numbered flip-flops 12_2, 12_4 . . . latch the delayed signals of the reference clock signal FREF (outputs from the inverters 11_1, 11_3) at their falling edges thereof. The output of the final-stage inverter 11_n of the inverter array 11_1 to 11_n is opened.

The timing extractor 30 performs a logic operation on the phase difference signals Q(1) to Q(n), and QB(1) to QB(n) received from the flip-flops 12_1 to 12_n to produce the pulse signal CK_S. The timing extractor extracts a timing that transits immediately after the rising and falling edges of the VCO output signal CKV from the reference clock signals CK(1), delayed by the inverter array 11_1 to 11_n. The timing extractor thus generates the pulse signal CK_S which is deviated from the rising and falling edges of the VCO output signal CKV by an error less than a resolution of the time-digital converter 10.

In the second time-digital converter 20, the VCO output signal CKV is sequentially delayed by the inverter array 21_1 to 21_m+1. The pulse signal CK_S generated by the timing extractor 30 is also sequentially delayed by the inverter array 22_1 to 22_m+1. The flip-flops 23_1 to 23_m respectively latch signals obtained by sequentially delaying the VCO output signal CKV at the timings when the rising edge of the pulse signal CK_S is sequentially delayed to produce the phase difference signals QU(1:m). In this manner, the phase difference with respect to the rising edge of the VCO output signal CKV in the time-digital converter 10 is converted into a digital signal at a resolution corresponding to a delay time accuracy of the inverter array 21_1 to 21_m+1, 22_1 to 22_m+1. Likewise, the flip-flops 24_1 to 24_m respectively latch signals obtained by sequentially delaying the VCO output signal CKV at the timings when the falling edge of the pulse signal CK_S is sequentially delayed to produce the phase difference signals QD(1:m). In this manner, a comparison error with respect to the falling edge of the CKV signal in the time-digital converter 10 is converted into a digital signal at a resolution corresponding to accuracy, of delayed time difference of the inverter array 21_1 to 21_m+1 and 22_1 to 22_m+1.

In order to match the logic for data inputting logic and the logic for data latching, the odd-number flip-flops of the flip-flops 23_1 to 23_m are supplied with inputs in negative logic (inverted signals of data input terminals) at their data terminals and clock terminals, whereas the even-numbered flip-flops thereof are supplied with inputs in positive logic at their data terminals and clock terminals. The odd-numbered flip-flops 23_1, 23_3, . . . receive delayed signals (outputs FD(1) . . . from the inverters 21_1, . . . ) of the VCO output signal in negative logic at data terminals, and latch them at falling edges of delayed signals (outputs FCK(1), . . . from the inverters 22_1, . . . ) of the pulse signal CK_S. The even-numbered flip-flops 23_2, 23_4, . . . receive delayed signals (output FD(1), . . . from the inverters 21_1, . . . ) of the VCO output signal in positive logic at data terminals, and latch them at rising edges of delayed signals (outputs FCK(1), . . . from the inverters 22_1, . . . ) of the pulse signal CK_S.

In order to match the logic for data inputting and the logic for data latching, the odd-numbered flip-flops of the flip-flops 24_1 to 24_m are supplied with inputs in positive logic at their data terminals and clock terminals, whereas the even numbered flip-flops thereof are supplied with inputs in negative logic at their data terminals and clock terminals. The odd-numbered flip-flops 24_1, 24_3, . . . receive delayed signals (outputs FD(1), . . . from the inverters 21_1, . . . ) of the VCO output signal in positive logic at their data terminals, and latch them at rising edges of delayed signals (outputs FCK(1), . . . from the inverters 22_1, . . . ) of the pulse signal CK_S. The even-numbered flip-flops 24_2, 24_4, . . . receive delayed signals (outputs FD(1), . . . from the inverters 21_1, . . . ) of the VCO output signal in negative logic at their data terminals, and latch them at falling edges of delayed signals (outputs FCK(1), . . . from the inverters 22_1, . . . ) of the pulse signal CK_S.

The outputs of the final-stage inverters 21_m+1 and 22_m+1 of the inverter array 21_1 to 21_m+1 and 22_1 to 22_m+1 are opened. In this case, the following relationship is established between a phase difference ΔTF1 between inverters in the inverter array 21_1 to 21_m+1 and a phase difference ΔTF2 between inverters in the inverter array 22_1 to 22_m+1.

$$\Delta TF1 > \Delta TF2$$

Figure 7:
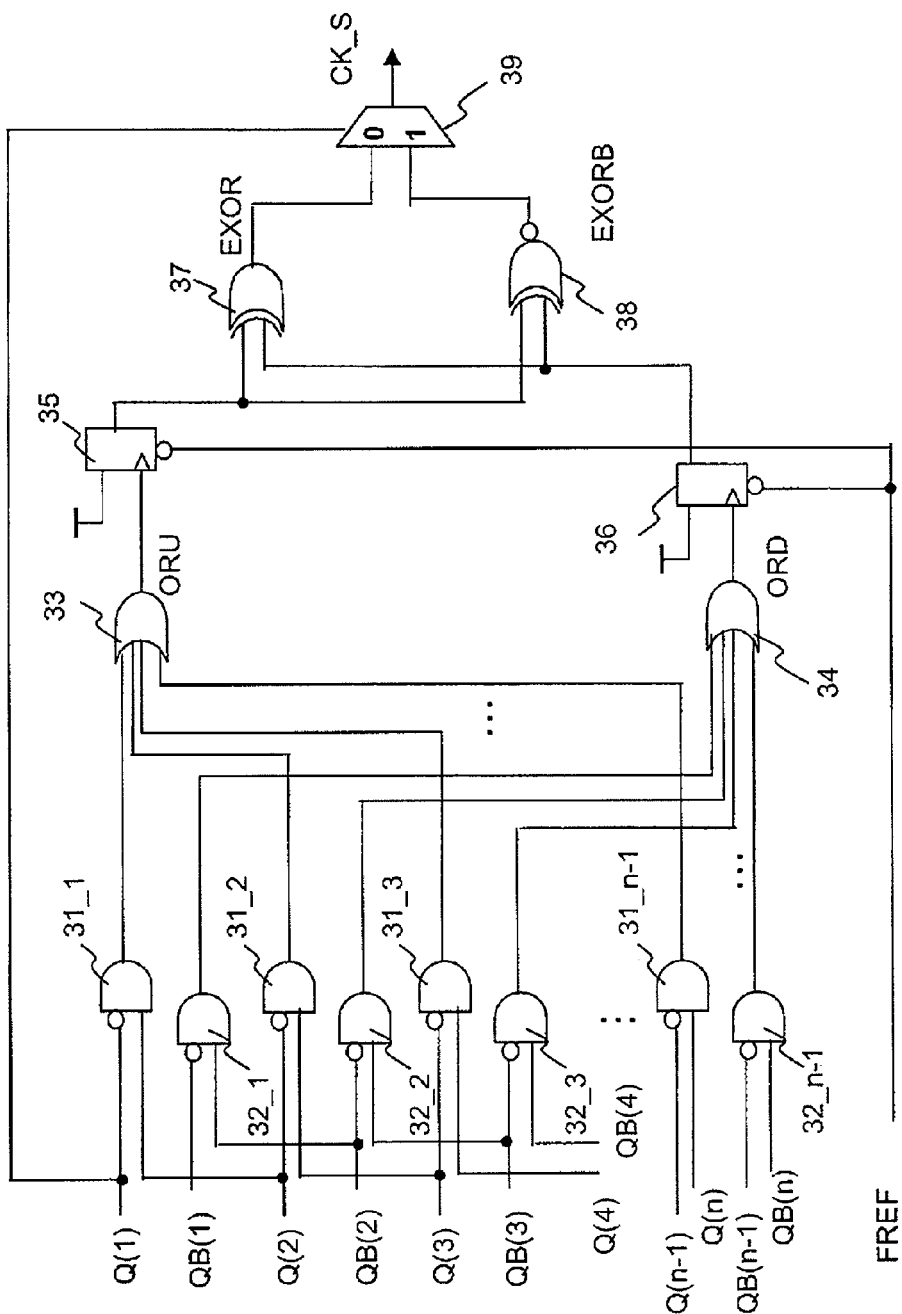
FIG. 7 is a diagram illustrating a configuration of a timing extractor 30 of the digital phase comparator according to the first exemplary embodiment of this invention.

FIG. 7 is a block diagram illustrating a configuration of the timing extractor 30 according to this exemplary embodiment. Referring to FIG. 7, the timing extractor 30 comprises composite logic gates 31_1 to 31_n−1 and 32_1 to 32_n−1, OR gates 33 and 34, reset-set flip-flops 35 and 36, exclusive OR gates 37 and 38, and a selector 39.

The composite logic gates 31_1 to 31_n are logic gates which produce logic "1" when the inputs are logic "01". Phase difference signals Q(i) and Q(i+1) (i=1 to (n−1)), of the phase difference signals Q(1) to Q(n) from the flip-flops 12_1 to 12_n, are supplied to the composite logic gate 31_i. Outputs from the composite logic gates 31_1 to 31_n are supplied to the OR gate 33, and the OR gate 33 produces logic "1" at a timing when any of the input signals becomes logic "1". The positive logic phase difference signals Q(1) to Q(n) and the negative logic phase difference signals QB(1) to QB(n) of the flip-flop 12_1 to 12_n in the time-digital converter 10 have all been reset to logic "0" during a time interval in which the reference clock signal FREF is at low level (Low or logic "0").

The phase difference signals Q(i) and Q(i+1) become logic "01" at the timing of a signal CK(i), that transits immediately after the rising of the CKV, of the signals CK(1) to CK(n−1) obtained by sequentially delaying the reference clock signal FREF by the flip-flops 12_1 to 12_n. As a result, a step signal ORU in synchronism with the signal CK(i) which transits immediately after the rising of the CKV is produced by the OR gate 33. Likewise, among the negative logic phase difference signals QB(1) to QB(n) of the flip-flops 12_1 to 12_n, the negative logic phase difference signals QB(i) and QB(i+1) are supplied to the composite logic gate 32_i. A step signal ORD is obtained from the OR gate 34. This step signal ORD is synchronous to a signal, of the sequentially delayed reference clock signals CK(1) to CK(n−1), that transits immediately after the falling of the CKV.

Each of the reset-set flip-flops 35 and 36 latches a signal supplied to the data terminal thereof at a rising timing of the signal connected to the clock terminal thereof when the signal connected to the reset terminal thereof is at high level (High, or logic "1"). When the signal connected to the reset terminal is Low, the output is reset and logic "0" is produced. The reference clock signal FREF is connected to the reset terminal, and logic "1" are produced in synchronization with the step signals ORU, ORD produced by the OR gates 33, 34 during the period when the FREF is High. This means that the outputs of the reset-set flip-flops 35, 36 are respectively synchronous with a signal of the sequentially delayed reference clock signals CK(1) to CK(n−1), that transits immediately after the rising and falling of the CKV.

The exclusive OR gates 37, 38 are in a complementary relationship in which when either one of the input signals is logic "1", logic "1" is produced by the exclusive OR gate 37 and logic "0" is produced by the exclusive OR gate 38. Accordingly, complementary pulse signals EXOR, EXORB are generated by the exclusive OR gates 37, 38 by supplying output signals of the reset-set flip-flops 35, 36 into them. In response to the phase difference signal Q(1) from the flip-flop 12_1, the selector 39 selects one of these two pulse signals EXOR, EXORB, whereby the pulse signal CK_S is obtained which is deviated by an error less than the resolution of the time-digital converter 10.

EXAMPLE 1

Figure 8:
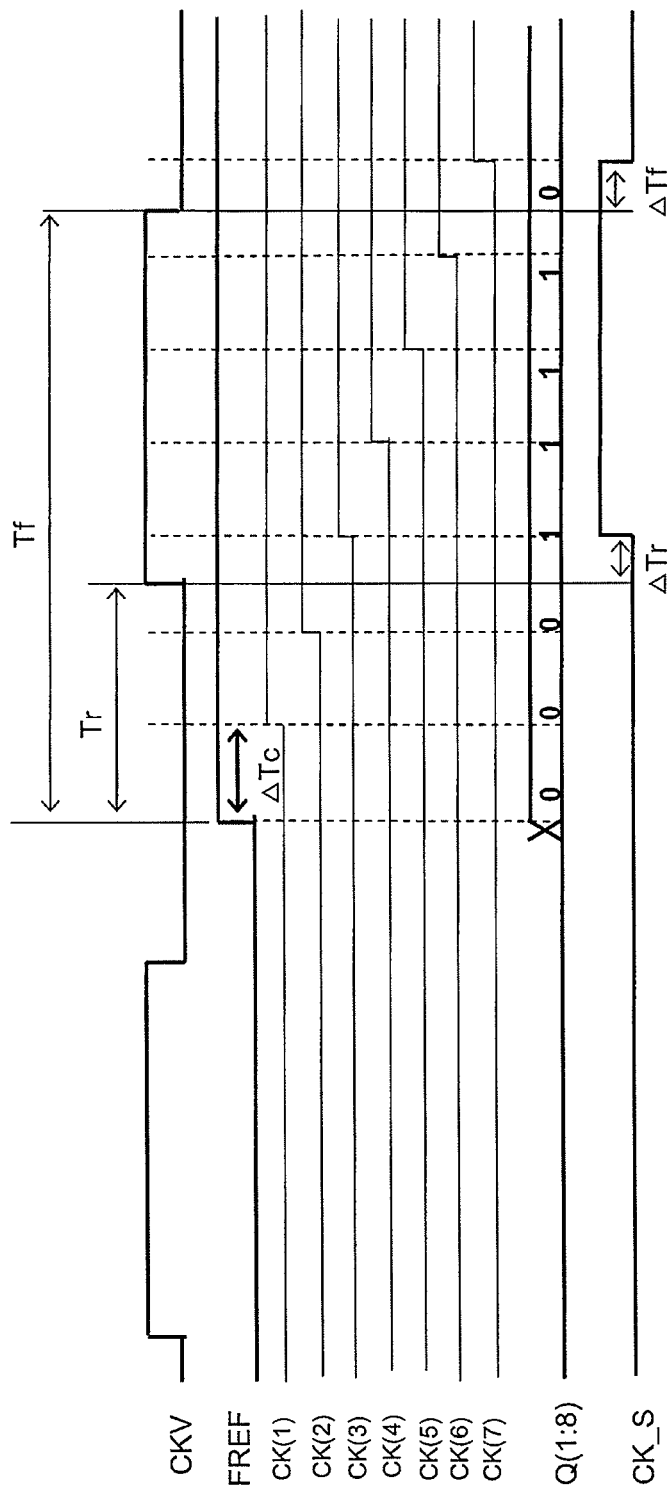
FIG. 8 is a timing chart for explaining an example of operation of a time-digital converter 10 of the digital phase comparator according to the first exemplary embodiment of this invention.
Figure 9:
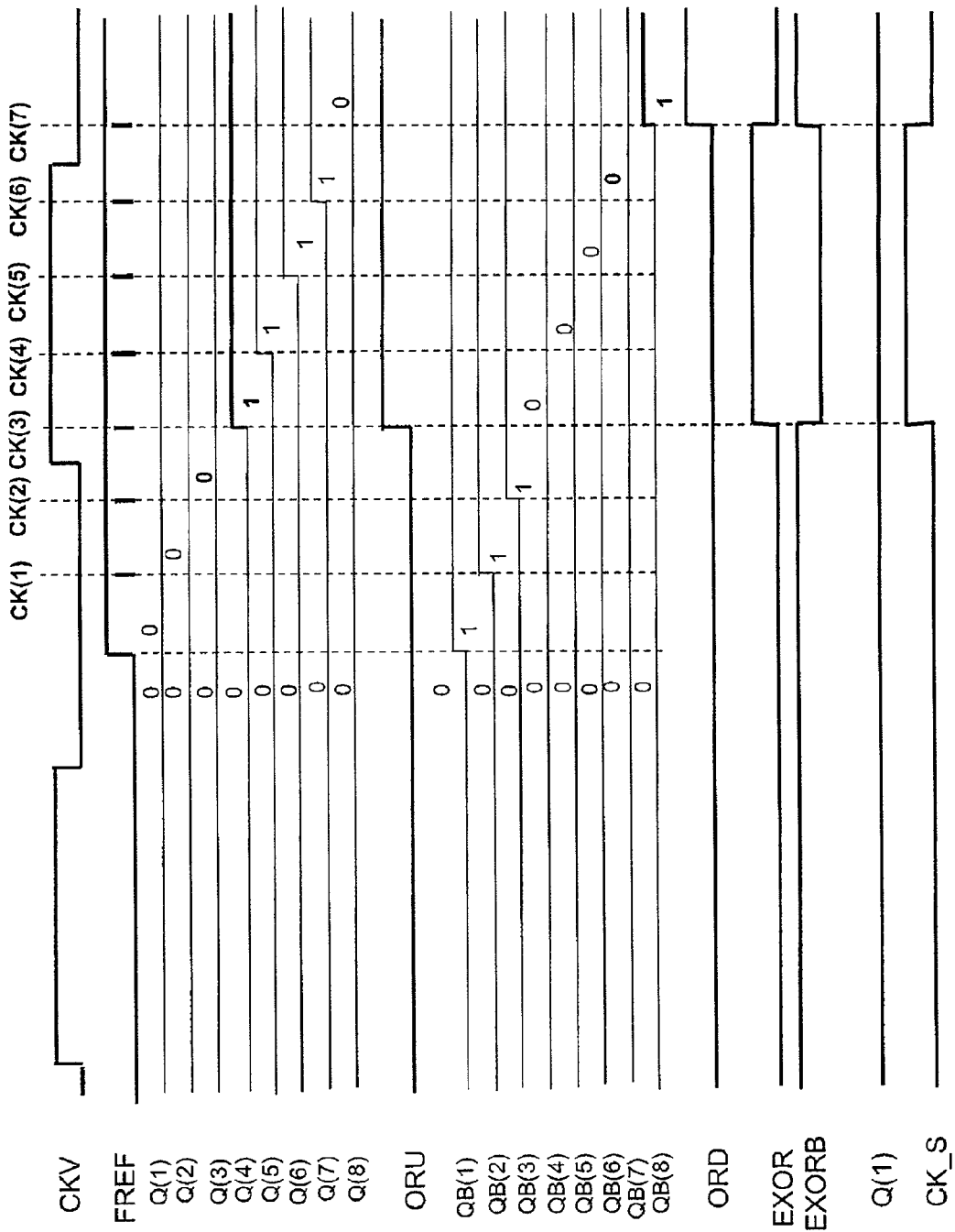
FIG. 9 is a timing chart for explaining an example of operation of the timing extractor 30 of the digital phase comparator according to the first exemplary embodiment of this invention.
Figure 10:
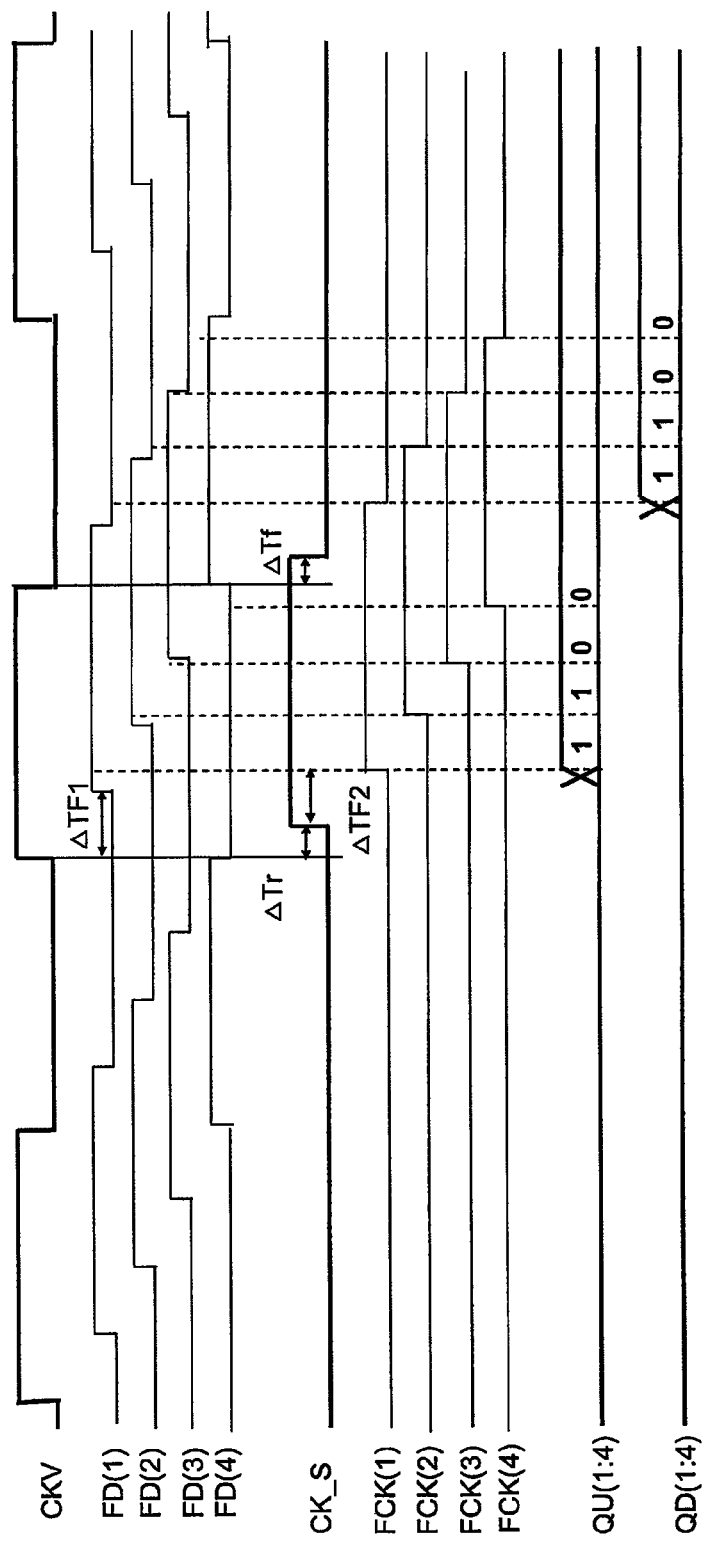
FIG. 10 is a timing chart for explaining an example of operation of a time-digital converter 20 of the digital phase comparator according to the first exemplary embodiment of this invention.

A specific example relating to this exemplary embodiment of the invention will be described in detail with reference to the drawings. FIGS. 8 to 10 are timing charts when n=8 and m=4 in the first exemplary embodiment shown in FIGS. 6 and 7. FIG. 8 is a timing chart relating to the time-digital converter 10, FIG. 9 is a timing chart relating to the timing extractor 30 when n=8 in FIG. 7, and FIG. 10 is a timing chart relating to the time-digital converter 20 when m=4 in FIG. 6.

FIG. 8 is the timing chart relating to the time-digital converter 10. With respect to the rising edge of the reference clock signal FREF, a phase difference at the rising of the VCO output signal CKV is denoted by Tr, a phase difference at the falling edge thereof is denoted by Tf. The time-digital converter 10 in the digital phase comparator of this example has the same configuration as the time-digital converter 10 comprising the inverter array 11_1 to 11_8, and the flip-flops 12_1 to 12_8 as shown in FIG. 6. In FIG. 8, the output CK(1) from the inverter 11_1 which receives and inverts the reference clock signal FREF is illustrated as a signal which rises after ΔTc from the rising of the FREF. This is because, as described before, negative logic is used (positive logic 0 and 1 are handled as 1 and 0, respectively). The flip-flop 12_2 produces logic "1" when sampled at the falling edge of the output CK(1) of the inverter 11_1. The same is applied to CK(3), CK(5), and CK(7).

In the time-digital converter 10, the flip-flops 12_1 to 12_8 produce values of input signals supplied to their data terminals at the transition timing of the input signals FREF, CK(1) to CK(7) supplied to the clock terminals thereof. Specifically, if the VCO output signal CKV, that is an input supplied to the data terminals, is logic "1", the flip-flops produce logic "1" as the phase difference signals, whereas if the VCO output signal CKV is logic "0", the flip-flops produce logic "0" as the phase difference signals. This means that when the flip-flops receive the reference clock signal FREF and its delayed signals, they produce a phase difference signal "0" if the VCO output signal CKV is "0", and produce the phase difference signal "1" if the VCO output signal CKV is "1".

It is assumed that delay time of each inverter of the inverter array 11_1 to 11_8 is denoted by ΔTc. The outputs CK(1) to CK(7) of the inverter array 11_1 to 11_8 are delayed respectively by from ΔTc to 7ΔTc with respect to the reference clock signal FREF. Each delay time ΔTc of the inverter array 11_1 to 11_8 defines resolution of the time-digital converter 10. The VCO output signal CKV has risen at the time instant when the reference clock signal FREF has passed three inverters, and has fallen at the time when the reference clock signal FREF has passed the seventh inverter. Accordingly, the phase difference signals Q(1:8) from the flip-flops are produced as logic "00011110". As for the delay of the inverter array, the phase difference Tr at the rising edge is between the delay of two inverters in the inverter array and the delay of three inverters therein (2ΔTc<Tr<3ΔTc), and the phase difference Tf at the falling edge is between the delay of six inverters in the inverter array and the delay of seven inverters therein (6ΔTc<Tf<7ΔTc). The phase difference Tr and the phase difference Tf can be represented as follows, by using the phase difference ΔTr between the rising edge of the VCO output signal CKV and the CK(3) and the phase difference ΔTf between the falling edge of the CKV and the CK(7).

$$Tr = 3\Delta Tc - \Delta Tr$$

$$Tf = 7\Delta Tc - \Delta Tf$$

FIG. 9 is a timing chart of the timing extractor 30 when n=8 in FIG. 7. The timing extractor 30 in the digital phase comparator of this example has a configuration comprising the composite logic gates 31_1 to 31_7, 32_1 to 32_7, seven-input OR gates 33, 34, the reset-set flip-flops 35, 36, the exclusive OR gates 37, 38, and the selector 39 as shown in FIG. 7.

In the timing extractor 30, a set of phase difference signals Q(3) and Q(4) in the phase difference signals Q(1) to Q(7) of the flip-flops 12_1 to 12_8 in the time-digital converter 10 supplied to the composite logic gates 31_1 to 31_7 becomes logic "01" at the transition timing of the CK(3), and the composite logic gate 31_3 produces logic "1". Accordingly, the seven-input OR gate 33 connected downstream of the composite logic gate 31_3 produces the step signal ORU from which the timing of the signal CK(3) transiting immediately after the rising of the CKV is extracted. Likewise, a set of negative logic phase difference signals QB(7) and QB(8) in the negative logic phase difference signals QB(1) to QB(7) of the flip-flops 12_1 to 12_n becomes logic "01" at the transition timing of the CK(7), and the OR gate 34 produces the step signal ORD from which the timing of the signal CK(7) transiting immediately after the rising of the CKV is extracted.

The reset-set flip-flops 35, 36 are supplied with the step signals ORU, ORD respectively produced by the OR gates 33, 34, as clock signals. Therefore, the reset-set flip-flops produce step signals in synchronism with the signals CK(3), CK(7), respectively, which transit immediately after the rising and falling of the CKV. These outputs of the flip-flops 35, 36 are supplied to the exclusive OR gate 37. Thus, the exclusive OR gate 37 generates the pulse signal EXOR which has the rising in synchronism with the CK(3) and the falling in synchronism with the CK(7). The exclusive OR gate 38 generates, as an output thereof, the pulse signal EXORB which is an inverted signal of the pulse signal EXOR. Since the phase difference signal Q(1) of the flip-flop 12_1 is Low, the selector 39 selects the output of the exclusive OR gate 37. The selector 39 generates the pulse signal CK_S which is deviated from the VCO output signal CKV by ΔTr at the rising and by ΔTf at the falling and which has an error less than the resolution of the time-digital converter 10.

FIG. 10 is the timing chart relating to the time-digital converter 20 when m=4 in FIG. 6. The time-digital converter 20 of the digital phase comparator of this example is configured to comprise the inverter arrays 21_1 to 21_5, and 22_1 to 22_5, and the flip-flops 23_1 to 23_4, and 24_1 to 24_4 as shown in FIG. 6. In FIG. 10, an output FD(1) from the inverter 21_1 which receives the CKV and is produced after inverting the same is illustrated as a signal which rises after ΔTF1 from the rising of the CKV. An output FCK(1) from the inverter 22_1 which receives the signal CK_S and inverts the same is also illustrated as a signal which rises after ΔTF2 from the rising of the CK_S. This is because, as described before, negative logic is used (positive logic 0 and 1 are handled as 1 and 0, respectively). When the output FD(1) of the inverter 21_1 is Low, the flip-flop 23_1 produces logic "1" when sampled at the falling edge of the inverter 22_1. The same applies to the FD(3) and the FCK(3).

In the time-digital converter 20, the flip-flops 23_1 to 23_4 sequentially latch signals FD(1) to FD(4) using the signals FCK(1) to FCK(4) as clock signals at the rising edge of the VCO output signal CKV. The signals FD(1) to FD(4) are signals obtained by sequentially delaying the VCO output signal CKV by the inverter array 21_1 to 21_4. The signals FCK(1) to FCK(4) are signals obtained by sequentially delaying the rising edge of the pulse signal CK_S by the inverter array 22_1 to 22_4. The flip-flops 23_1 to 23_4 produce logic "1" when the phase of the rising edges of the input signals FD(1) to FD(4) supplied to the data terminals thereof are advanced over the rising edge of the input signals FCK(1) to FCK(4) supplied to the clock terminals thereof. Thus, the phase difference signals QU(1:4) from the flip-flops 23_1 to 23_4 become logic "1100".

Likewise, at the falling edge of the VCO output signal CKV, the flip-flops 24_1 to 24_4 sequentially latch the signals FD(1) to FD(4) by using the signals FCK(1) to FCK(4) as clock signals. The signals FD(1) to FD(4) are signals obtained by sequentially delaying the VCO output signal CKV by the inverter array 21_1 to 21_4. The signals FCK(1) to FCK(4) are signals obtained by sequentially delaying the falling edge of the pulse signal CK_S by the inverter array 22_1 to 22_4. The flip-flops 24_1 to 24_4 produce logic "1" when the phase of the falling edges of the FD(1) to FD(4) are advanced over the falling edges of the input signals FCK(1) to FCK(4) supplied to the clock terminals thereof. Thus, the phase difference signals QD(1:4) from the flip-flops 24_1 to 24_4 become logic "1100".

The phase difference signals QU(1:4) from the flip-flops 23_1 to 23_4 and the phase difference signals QD(1:4) from the flip-flops 24_1 to 24_4 serve as phase difference detection signals, and are supplied to the VCO as digital codes to control the phase of the VCO clock signal. In this manner, the phase of the VCO clock signal is controlled by utilizing the phase difference detection signals from the time-digital converter 10 of the digital phase comparator and the phase difference detection signals from the time-digital converter 20 thereof.

The rising edge of the VCO output signal CKV is advanced by ΔTr with respect to the rising edge of the CK_S at the time instant of output from the timing extractor 30, while the falling edge of the CKV is advanced by ΔTf with respect to the falling edge of the CK_S thereat. The phase difference ΔTF1 between the inverters of the inverter array 21_1 to 21_4 and the phase difference ΔTF2 between the inverters of the inverter array 22_1 to 22_4 assume the following relationship:

$$\Delta TF1 > \Delta TF2.$$

Therefore, the phase difference becomes smaller by ΔTF1-ΔTF2 each time as the signal passes the respective inverters of the inverter array 22_1 to 22_4. The resolution of the time-digital converter 20 is ΔTF1-ΔTF2.

In FIG. 10, as for the rising edge, the phase of the data input FD(2) is advanced with respect to the clock input FCK(2) until the second flip-flop 23_2, and therefore logic "1" is produced. However, the phase relationship is reversed once the signal has passed the third inverter 21_3. This means that the phase of the FD(3) is retarded with respect to the FCK(3).

Therefore, the third and onward flip-flops produce logic "0", and the phase difference ΔTr can be represented as double a delay difference of ΔTF1-ΔTF2 of the inverter array. In other words, the following relationship is established:

$$\Delta Tr = 2(\Delta TF1 - \Delta TF2).$$

Likewise, as for the falling edge, the phase of the data input FD(2) is advanced with respect to the clock input FCK(2) until the second flip-flop 24_2. Therefore, the following relationship is established for the phase difference ΔTf:

$$\Delta Tf = 2(\Delta TF1 - \Delta TF2).$$

It can be seen from the outputs of the time-digital converter 10 and the time-digital converter 20 that Tr=3ΔTc−ΔTr and Tf=7ΔTc−ΔTf can be rewritten as follows:

$$Tr = 3\Delta Tc - 2(\Delta TF1 - \Delta TF2)$$

$$Tf = 7\Delta Tc - 2(\Delta TF1 - \Delta TF2).$$

In the example as described above, the phase difference information of the VCO output signal CKV with respect to the reference clock signal FREF obtained by the time-digital converter 10 is corrected with the use of phase difference information obtained by the time-digital converter 20. The second time-digital converter 20 compares the phases with the use of the pulse signal CK_S obtained by the timing extractor 30. In this manner, the phase difference information is obtained from the two time-digital converters and corrected, whereby high-resolution digital phase comparison is realized without causing significant increase in circuit area or power consumption.

According to a conventional technique, when the number of inverters in an inverter array is denoted by n and delay of each inverter is denoted by ΔTo, the delay of the inverter array must cover a cycle period Tcy of VCO. For example, 32 inverters are required in order to cover the VCO cycle Tcy. In contrast, according to this invention, phase difference information of the time-digital converter 10 and the time-digital converter 20 is used. Therefore, it is possible to configure the first time-digital converter 10 with a low resolution by using inverters with a large delay time, and to configure the second time-digital converter 20 with a high-resolution by using a difference in delay time between two inverters. For example, when the inverters of the first time-digital converter 10 have a delay time of ΔTo times four, eight inverters are required to cover the VCO cycle Tcy. Further, in the second time-digital converter 20, it is only required to cover the delay time of the inverters of the first time-digital converter 10. This means that, if the delay time difference between the inverters of the second time-digital converter 20 is ΔTo, four inverters will be enough to cover.

In other words, the conventional technique requires 32 inverters operating at high speed. In contrast, according to this invention, the first time-digital converter requires eight inverters, while the second time-digital converter requires two arrays each composed of four inverters, and thus 16 inverters in total are required. In addition, only four of these inverters are high-speed inverters operating at a high speed, and hence the power consumption can be reduced. Overall, the reduction of components of the inverter array and the data holding circuit enables substantial reduction of power consumption and circuit area. The time-digital converter 20 is configured to compare only the phase differences less than an inverter delay of one inverter in the time-digital converter 10. Therefore, even though high-speed inverters are used in the second time-digital converter, a higher-resolution phase comparator can be realized since the second time-digital converter utilizes a delay time difference between two inverters. In this case as well, the period to be covered by high-speed inverters in the second time-digital converter is only one inverter delay in the time-digital converter 10, thus not resulting in significant increase in the power consumption.

According to this example, the time-digital converter 20 is configured to compare only phase differences which are less than the delay of one inverter in the time-digital converter 10. Firstly, the time-digital converter 10 compares the phases. Using the pulse signal CK_S obtained by the timing extractor 30 using the output from the time-digital converter 10, the second time-digital converter 20 capable of operating at a higher speed further compares the phases. Then, correction is performed by using the phase comparison results of the first and second time-digital converters, whereby high-resolution digital phase comparison can be realized without causing significant increase in the circuit area or power consumption.

(Second Exemplary Embodiment)

Figure 11:
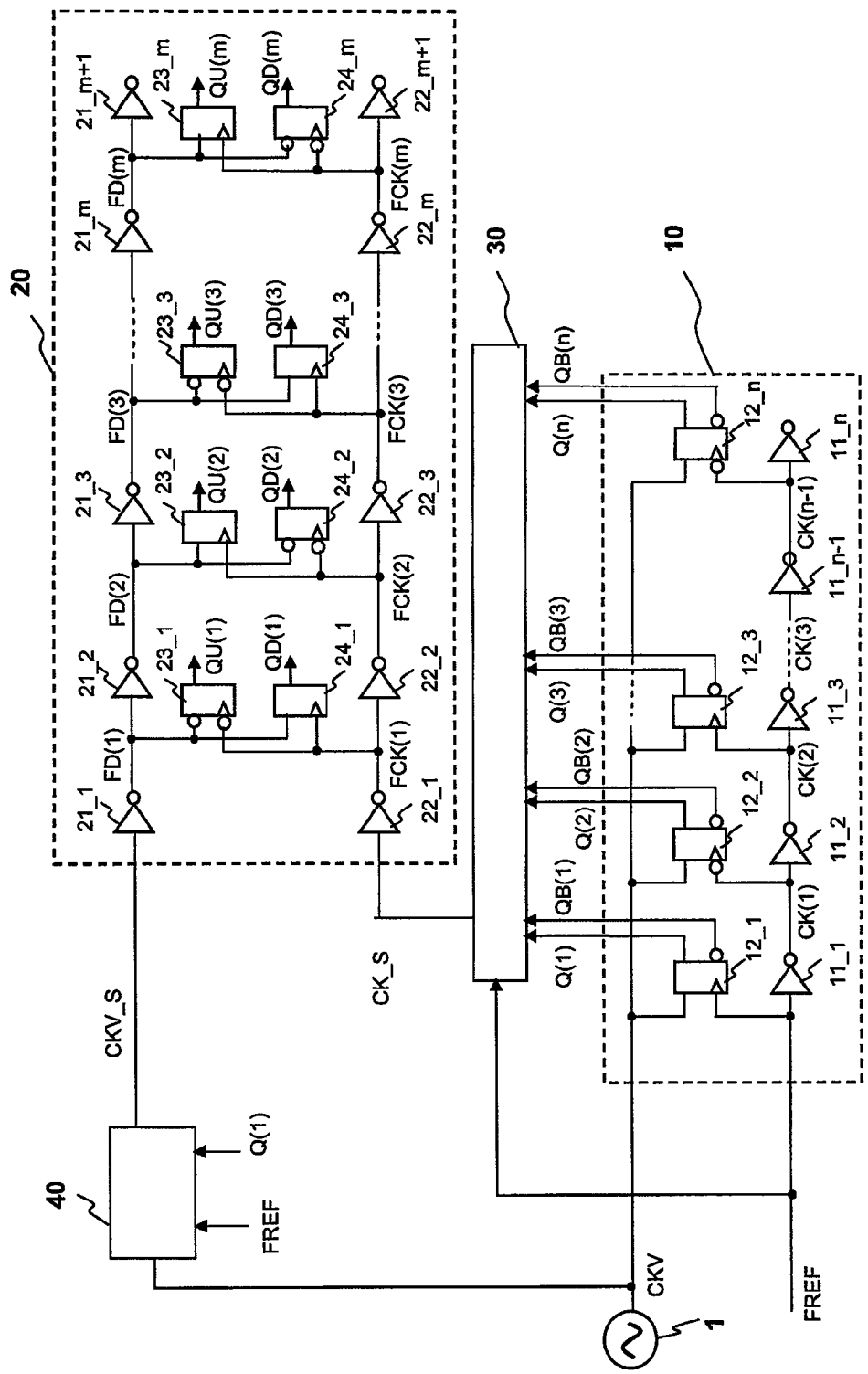
FIG. 11 is a diagram illustrating a configuration of a digital phase comparator according to a second exemplary embodiment of this invention.

FIG. 11 is a block diagram illustrating a digital phase comparator according to a second exemplary embodiment of this invention. Referring to FIG. 11, the digital phase comparator has a configuration in which a timing adjuster 40 is additionally provided between the VCO and the second time-digital converter 20 in the first embodiment shown in FIG. 6.

Figure 12:
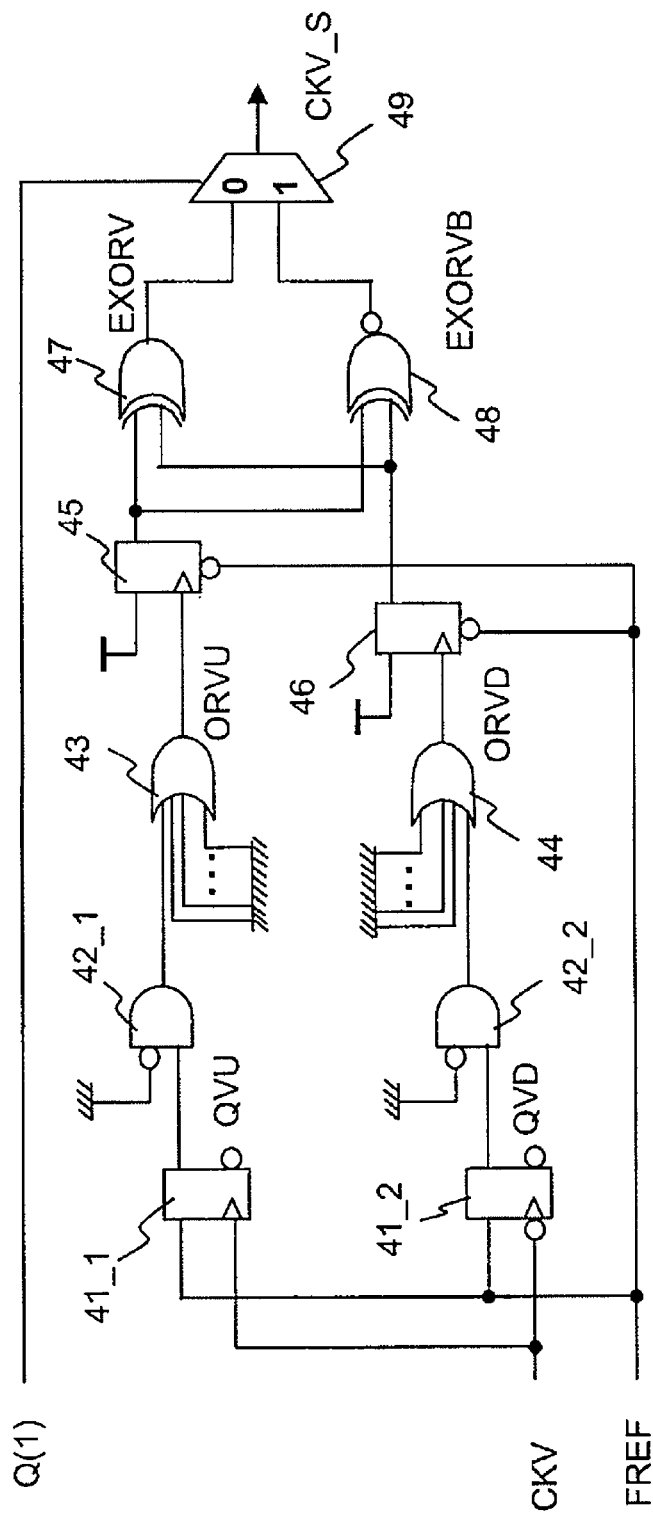
FIG. 12 is a diagram illustrating a configuration of a timing adjuster 40 of the digital phase comparator according to the second exemplary embodiment of this invention.

FIG. 12 is a block diagram illustrating a configuration of the timing adjuster 40 according to the second exemplary embodiment shown in FIG. 11. Referring to FIG. 12, the timing adjuster 40 comprises flip-flops 41_1, 41_2, composite logic gates 42_1, 42_2, OR gates 43, 44, reset-set flip-flops 45, 46, exclusive OR gates 47, 48, and a selector 49. The flip-flops 41_1, 41_2 are set so as to have the same delay time as that of the flip-flops 12_1 to 12_n in the time-digital converter 10.

The composite logic gates 42_1, 42_2, the OR gates 43, 44, the reset-set flip-flops 45, 46, the exclusive OR gates 47, 48, and the selector 49 are also set so as to have the same delay time as the composite logic gates 31_1 to 31_7, 32_1 to 32_7, the seven-input OR gates 33, 34, the reset-set flip-flop 35, 36, the exclusive OR gates 37, 38, and the selector 39, respectively, in the timing extractor 30 of the first embodiment. Therefore, a delay time from when the signals CK(1) to CK(n−1) obtained by sequentially delaying the reference clock signal FREF by the inverter array 11_1 to 11_n are produced until when the pulse signal CK_S is produced by the timing extractor 30 is the same as a delay time from when the VCO output signal CKV is supplied to the timing adjuster 40 until when a pulse signal CKV_S is produced thereby.

The VCO output signal CKV is supplied to clock input terminals of the flip-flops 41_1, 41_2, which latch the reference FREF signals supplied to data input terminals thereof respectively at the rising edge and the falling edge of the CKV. The flip-flops generate step signals in synchronism with the rising edge and the falling edge of the CKV, respectively. The composite logic gates 42_1, 42_2 have negative logic side inputs fixed to Low and produce logic "1" when the positive logic side inputs thereof become High. Outputs of the composite logic gates 42_1, 42_2 are respectively supplied to the OR gates 43, 44, which generate step signals in synchronism with the rising edge and the falling edge of the CKV by producing logic "1" at a timing when the input signals become logic "1".

Like the reset-set flip-flops 35, 36 of the timing extractor 30 in the first example, the reset-set flip-flop 45, 46 have reset terminals to which the reference clock signal FREF is connected. During the period when the signal FREF is High, the flip-flops 45, 46 produce logic "1" in synchronism with the step signals produced by the OR gates 43, 44. This means that the outputs of the reset-set flip-flops 45, 46 are synchronous with the rising edge and the edge of the CKV, respectively.

A complementary relationship is established between the exclusive OR gates 47, 48, in which when either one of the inputs to the exclusive OR gates is logic "1", the exclusive OR gate 47 produces logic "1" while the exclusive OR gate 48 produces logic "0". Therefore, complementary pulse signals are generated by the exclusive OR gates 47, 48 by supplying thereto output signals from the reset-set flip-flops 45, 46. The selector 49 selects one of these two pulse signals according to the phase difference signal Q(1) of the flip-flop 12_1 in the time-digital converter 10, whereby a pulse signal is obtained which is synchronous with the rising edge and the falling edge of the CKV.

EXAMPLE 2

Figure 13:
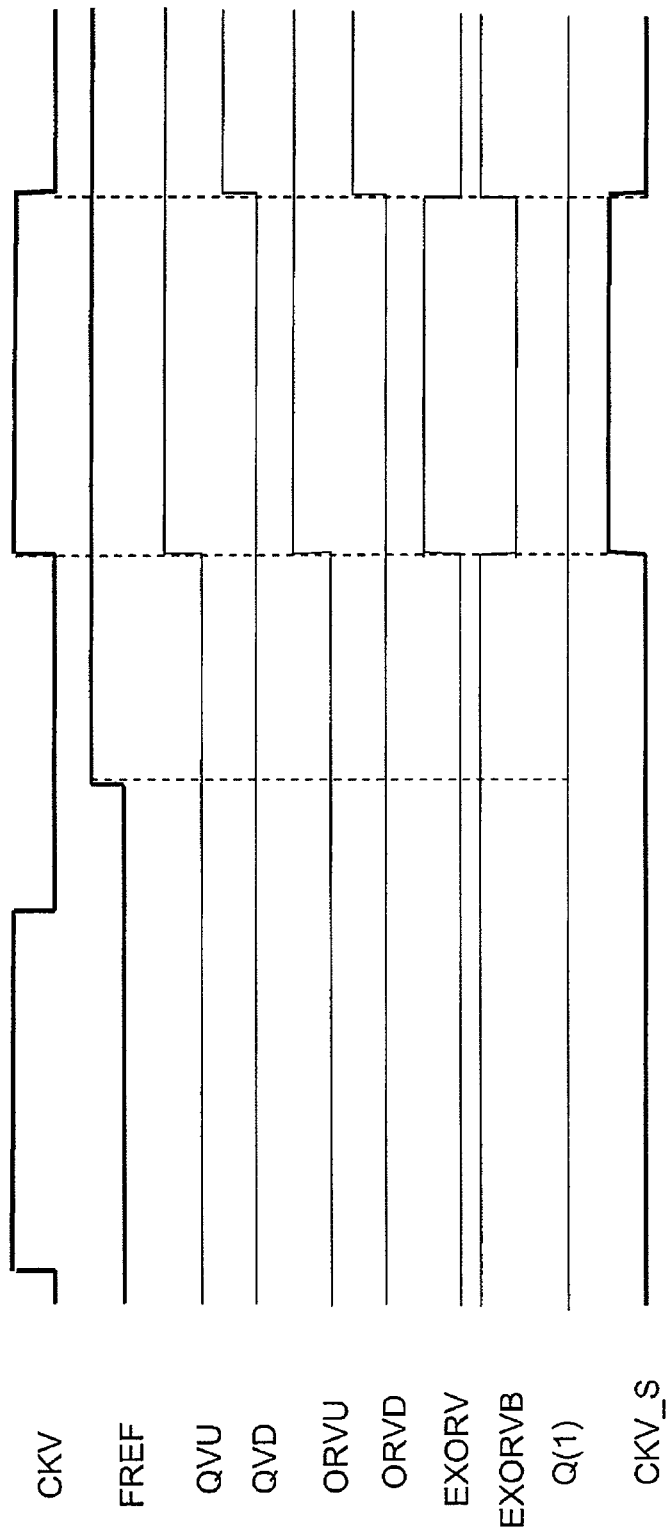
FIG. 13 is a timing chart for explaining an example of operation of the timing adjuster 40 of the digital phase comparator according to the second exemplary embodiment of this invention.
Figure 14:
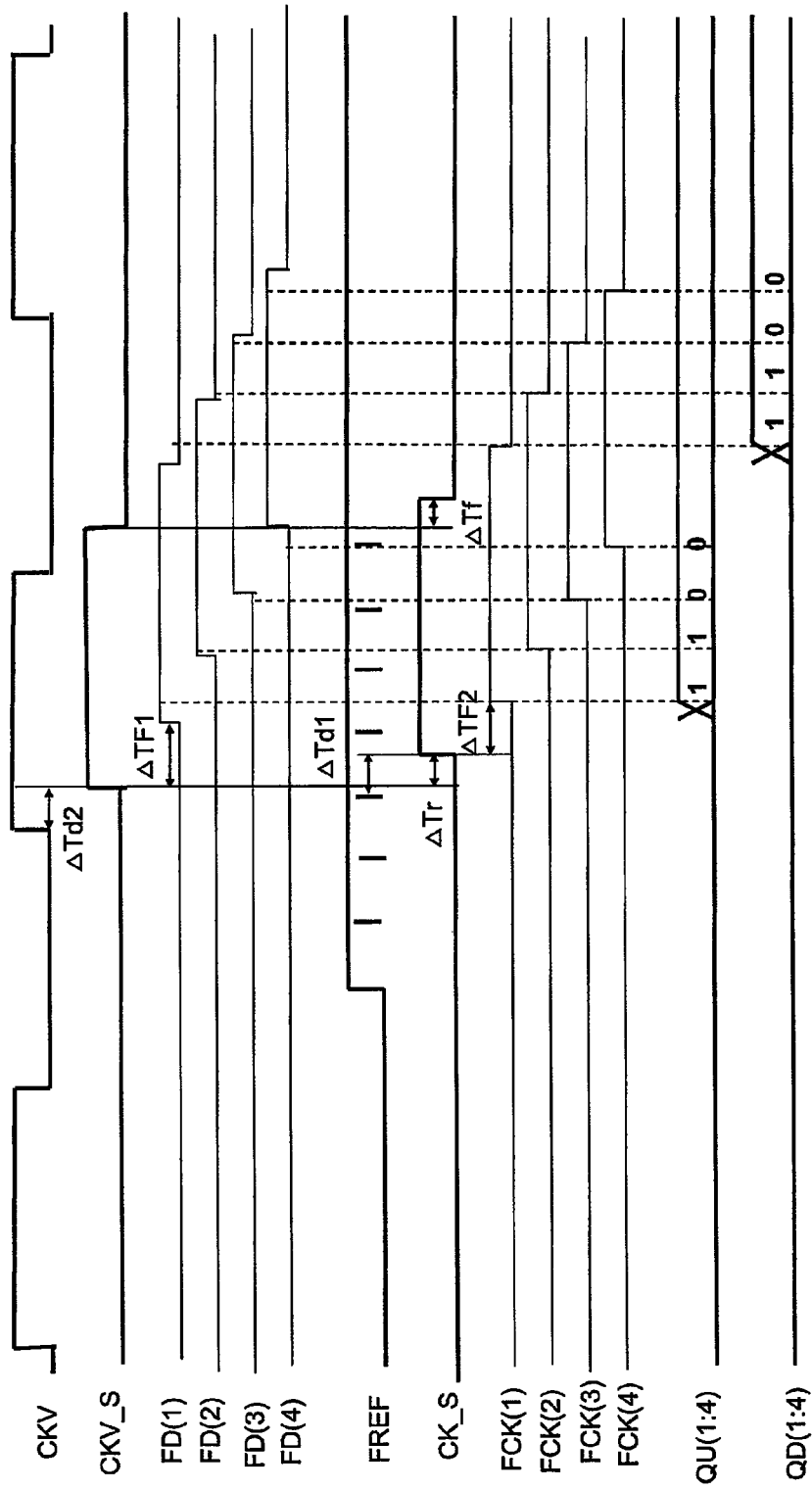
FIG. 14 is a timing chart for explaining an example of operation of a time-digital converter 20 of the digital phase comparator according to the second exemplary embodiment of this invention.

A specific example relating to this exemplary embodiment of the invention will be described in detail with reference to the drawings. FIGS. 13 and 14 are timing charts when n=8 and m=4 in the second exemplary embodiment shown in FIG. 11. Operation of the time-digital converter 10 and the timing extractor 30 is the same as the operation of those of the digital phase comparator described in the example of the first exemplary embodiment illustrated in FIGS. 8 and 9. Therefore, the description thereof is omitted here. However, it is assumed here that there is a delay time ΔTd1 from when the signals CK(1) to CK(7) obtained by sequentially delaying the reference clock signal FREF by the inverter array 11_1 to 11_8 are produced until when the pulse signal CK_S is produced by the timing extractor 30.

FIG. 13 is a timing chart of the timing adjuster 40. In the timing adjuster 40, the flip-flop 41_1 latches the reference clock signal FREF at the rising edge of the VCO output signal CKV, and the step signal ORVU in synchronism with the rising edge of the CKV is produced via the composite logic gate 42_1 and the OR gate 43. Likewise, the flip-flop 41_2 latches the reference clock signal FREF at the falling edge of the VCO output signal CKV, and the step signal ORVD in synchronism with the falling edge of the signal CKV is produced via the composite logic gate 42_2 and the OR gate 44.

The step signals ORVU, ORVD produced by the OR gates 43, 44 are respectively supplied to the reset-set flip-flops 45, 46 as clock signals, and thus step signals in synchronism with rising and falling edges of the CKV are produced by the reset-set flip-flops. These outputs of the flip-flops 45, 46 are supplied to the exclusive OR gate 47. The exclusive OR gate 47 thereby generates the pulse signal which has the rising edge in synchronism with the rising edge of the CKV and the falling edge in synchronism with the falling edge of the CKV. The exclusive OR gate 48 produces an inverted signal of this pulse signal. In this state, the phase difference signal Q(1) from the flip-flop 12_1 in the time-digital converter 10 is Low, and hence the selector 49 selects the output of the exclusive OR gate 47 to produce the pulse signal CKV_S. The pulse signal CKV_S is generated as a signal delayed by a delay time ΔTd2 with respect to the VCO output signal CKV as a result of having passed through the flip-flops 41_1, 41_2, the composite logic gates 42_1, 42_2, the OR gates 43, 44, the reset-set flip-flops 45, 46, the exclusive OR gate 47, and the selector 49.

FIG. 14 is a timing chart relating to the time-digital converter 20 when m=4 in FIG. 11. The time-digital converter 20 of the digital phase comparator in this example has the same configuration as that in the example of the first exemplary embodiment shown in FIG. 6, except that the CKV_S is used instead of the VCO output signal CKV. In FIG. 14, like FIG. 10, the output FD(1) from the inverter 21_1 which receives the signal CKV_S and inverts the same to produce an inverted signal is illustrated as a signal which rises after ΔTF1 from the rising of the CKV_S. Further, the output FCK(1) from the inverter 22_1 which receives the signal CK_S and inverts the same is illustrated as a signal which rises after ΔTF2 from the rising of the CK_S. This is because, as described before, negative logic is used (positive logic 0 and 1 are handled as 1 and 0). The flip-flop 23_1 produces logic "1" when sampled at the falling edge of the output CK(1) of the inverter 22_1 in a case where the output FD(1) of the inverter 21_1 is Low. The same applies to the FD(3) and the FCK(3).

In the time-digital converter 20 of this example, instead of the VCO output signal CKV, the output CKV_S from the timing adjuster 40, which is delayed by ΔTd2 with respect to the CKV, is sequentially delayed by the inverter array 21_1 to 21_4. As for the rising edge, the flip-flops 23_1 to 23_4 sequentially latch the sequentially delayed signals, as clock signals, the signals FCK(1) to FCK(4) which are obtained by sequentially delaying the rising edge of the pulse signal CK_S from the timing extractor 30 by the inverter array 22_1 to 22_4. As for the falling edge as well, the falling edge of the output CKV_S from the timing adjuster 40 is sequentially delayed by the inverter array 21_1 to 21_4. The flip-flops 24_1 to 24_4 sequentially latch the sequentially delayed signals, as clock signals, the signals FCK(1) to FCK(4) which are obtained by sequentially delaying the falling edge of pulse signal CK_S from the timing extractor 30 by the inverter array 22_1 to 22_4. Particular operation for the phase comparison is the same as that of the example in the first exemplary embodiment, and thus description thereof will be omitted.

As described above, phase comparison is performed by the second time-digital converter 20, using the pulse signal CKV_S obtained by the timing adjuster 40 and the pulse signal CK_S obtained by the timing extractor 30. In the first exemplary embodiment, there is a delay time ΔTd1 from when the signals CK(1) to CK(n−1) obtained by sequentially delaying the reference clock signal FREF by the inverter array 11_1 to 11_n are produced until when the pulse signal CK_S is produced by the timing extractor 30. Even if this delay time ΔTd1 is unnegligible, the delay time from when the VCO output signal CKV is supplied to the timing adjuster 40 until when the pulse signal CKV_S is produced thereby is equal to ΔTd2. Therefore, it is made possible by correcting the result of the phase comparison by the time-digital converter 20 to realize high-resolution digital phase comparison without causing significant increase in circuit area or power consumption.

Like the first exemplary embodiment, this example also makes it possible to realize high-resolution digital phase comparison without causing significant increase in circuit area or power consumption. Further, like the pulse signal CK_S produced by the timing extractor 30, the pulse signal CKV_S produced by the timing adjuster 40 in this example is a one-shot pulse signal. Accordingly, no signal transition occurs in the inverter array 21_1 to 21_m except during the period when phase comparison is performed by the time-digital converter 20. Therefore, more reduction of power consumption is possible compared to the digital phase comparator according to the first exemplary embodiment.

(Third Exemplary Embodiment)

Figure 15:
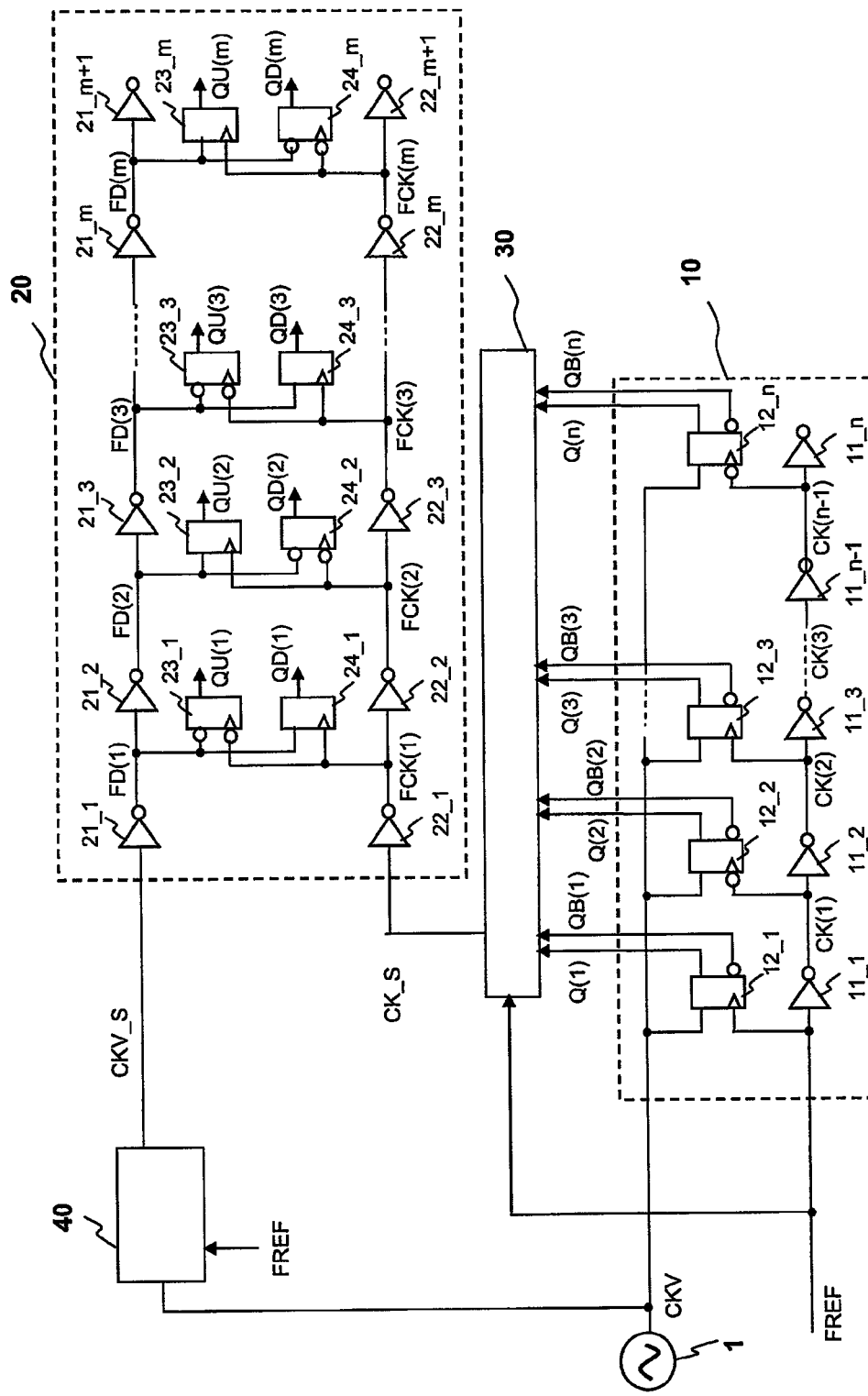
FIG. 15 is a diagram illustrating a configuration of a digital phase comparator according to a third exemplary embodiment of this invention.

FIG. 15 is a block diagram illustrating a digital phase comparator according to a third exemplary embodiment of this invention. Referring to FIG. 15, this digital phase comparator has a configuration in which the phase difference signal Q(1) is omitted. The phase difference signal Q(1) is a signal supplied to the timing adjuster 40 from the flip-flop 12_1 in the time-digital converter 10 according to the second exemplary embodiment shown in FIG. 11.

Figure 16:
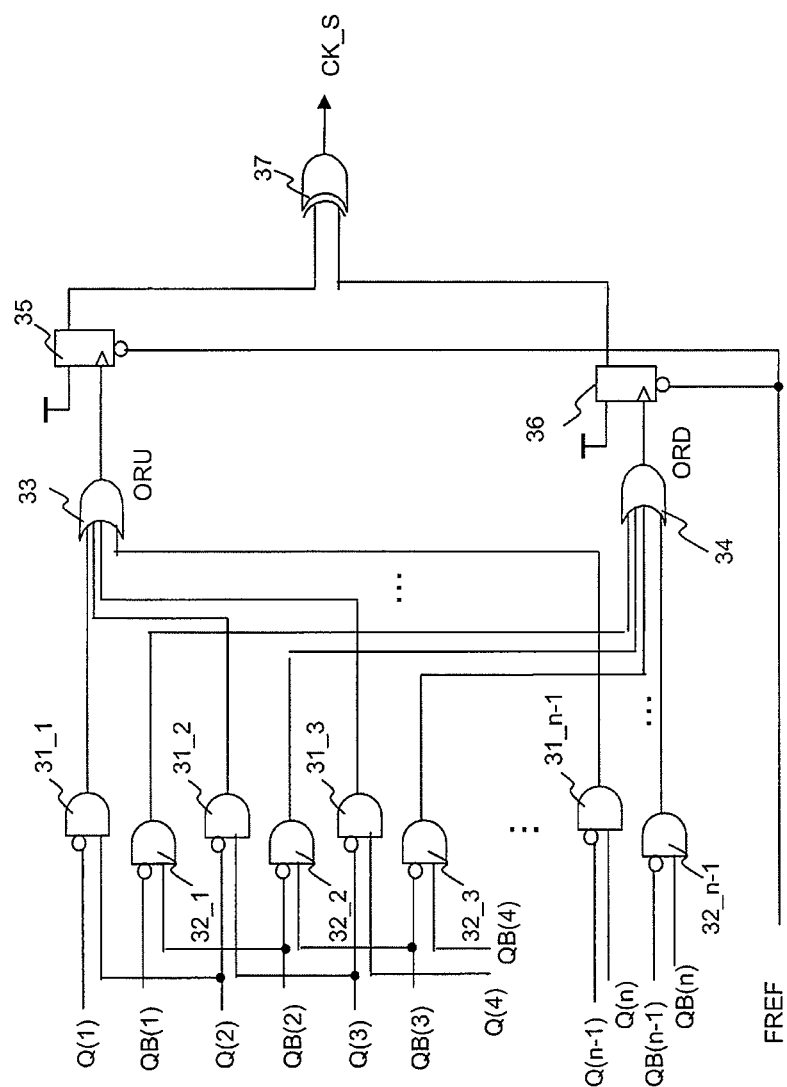
FIG. 16 is a diagram illustrating a configuration of a timing extractor 30 of the digital phase comparator according to the third exemplary embodiment of this invention.
Figure 17:
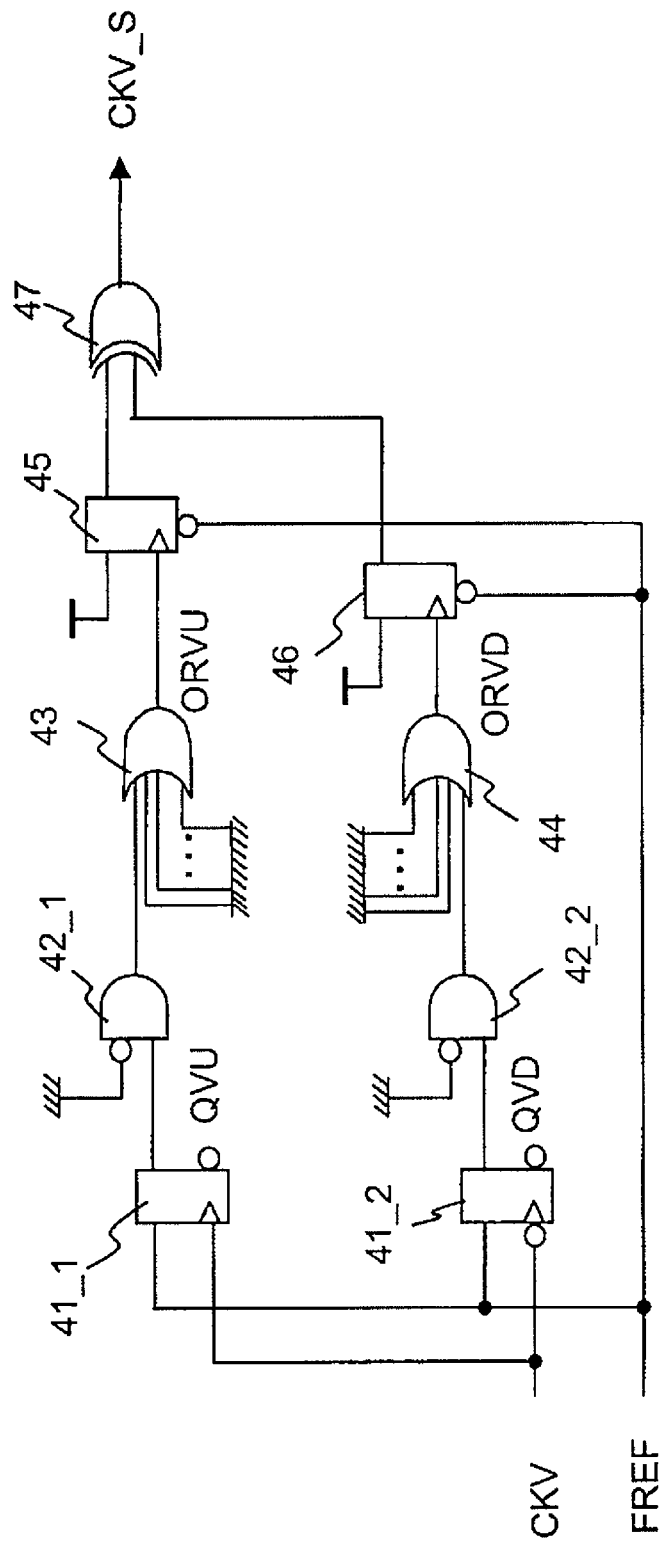
FIG. 17 is a diagram illustrating a configuration of a timing adjuster 40 of the digital phase comparator according to the third exemplary embodiment of this invention.

FIG. 16 is a block diagram illustrating a configuration of a timing extractor 30 according to the third exemplary embodiment shown in FIG. 15. Referring to FIG. 16, the timing extractor 30 according to this exemplary embodiment has a configuration in which the exclusive OR gate 38 and the selector 39 are omitted from the configuration of the timing extractor 30 shown in FIG. 7. FIG. 17 is a block diagram illustrating a configuration of a timing adjuster 40 according to the third exemplary embodiment shown in FIG. 15. Referring to FIG. 17, the timing adjuster 40 according to this exemplary embodiment has a configuration in which the exclusive OR gate 48 and the selector 49 are omitted from the configuration of the timing adjuster 40 shown in FIG. 12.

EXAMPLE 3

Figure 18:
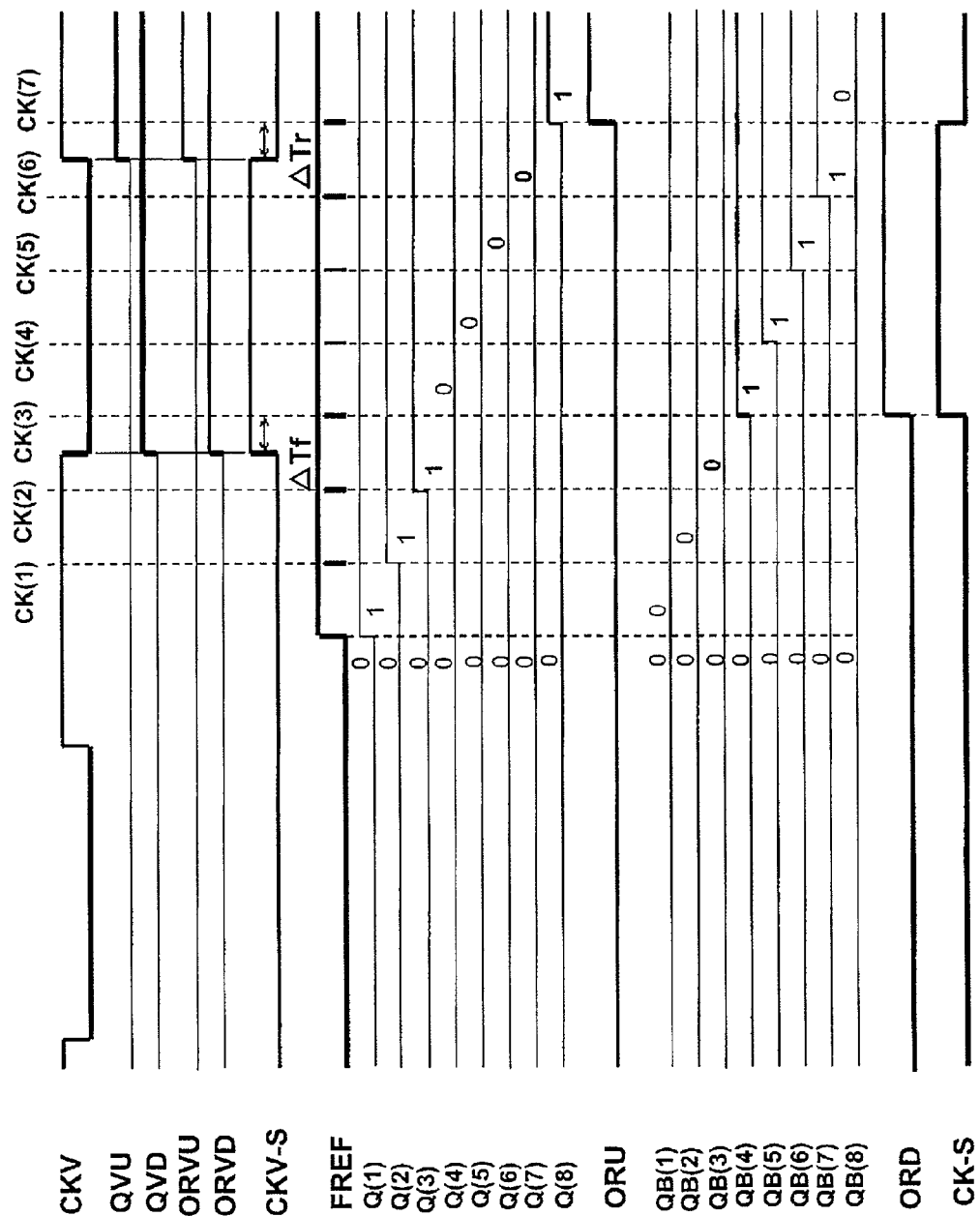
FIG. 18 is a timing chart for explaining an example of operation of the timing extractor 30 and the timing adjuster 40 of the digital phase comparator according to the third exemplary embodiment of this invention.

A specific example relating to this exemplary embodiment of the invention will be described in detail with reference to the drawings. FIG. 18 is a timing chart when n=8 in the timing extractor 30 and the timing adjuster 40 according to the third exemplary embodiment shown in FIG. 15. When m=4 in the third exemplary embodiment shown in FIG. 15, operation of the time-digital converter 10 and the time-digital converter 20 is the same as operation of those of the digital phase comparator as described in the examples according to the first and second exemplary embodiments shown in FIG. 8 and FIG. 14, and thus description thereof will be omitted. However, the VCO output signal CKV is a signal deviated by half cycle with respect to the timing chart shown in FIG. 8, and the phase difference signals Q(1:8) are produced as logic "11100001" by the flip-flops 12_1 to 12_8. In this case, the phase difference Tr at the rising edge of the VCO output signal CKV with respect to the reference clock signal FREF and the phase difference Tf at the falling edge thereof are respectively represented a follows:

$$Tr = 7\Delta Tc - \Delta Tr$$

$$Tf = 3\Delta Tc - \Delta Tf.$$

Referring to FIG. 18, a relationship is established between the VCO output signal CKV and the reference clock signal FREF, in which after the rising edge of the signal FREF, the falling edge of the CKV appears prior to the rising edge thereof. Meanwhile, in the timing adjuster 40, a step signal ORVD in synchronism with the falling edge of the CKV is produced by the OR gate 44, and then a step signal ORVU in synchronism with the rising edge of the CKV is produced by the OR gate 43. These step signals are supplied to the exclusive OR gate 47 via the reset-set flip-flops 45, 46. The output CKV_S thereof is a pulse signal which has the rising edge in synchronism with the falling edge of the CKV and the falling edge in synchronism with the rising edge of the CKV.

On the other hand, in the timing extractor 30, a step signal ORD, in which a timing of the signal CK(3) transiting immediately after the falling of the CKV is extracted, is produced by the OR gate 34, and then a step signal ORU, in which a timing of the signal CK(7) transiting immediately after the rising of the VCO output signal CKV is extracted, is produced by the OR gate 33. These step signals ORU, ORD are supplied to the exclusive OR gate 37 via the reset-set flip-flops 35, 36. The output signal CK_S thereof is a pulse signal which has the rising edge in synchronism with the signal CK(3) transiting immediately after the falling edge of the CKV and the falling edge in synchronism with the signal CK(7) transiting at the rising edge of the CKV.

A relationship is established between the signals CKV_S and CK_S supplied to the time-digital converter 20, in which the rising edge is deviated from the falling of the CKV by the phase difference ΔTf of the signal CK(3), and the falling edge is deviated from the rising of the CKV by the phase difference ΔTr of the signal CK(7). Therefore, if a phase comparison in the time-digital converter 10 results in Tr>Tf, the logic circuit 2 handles the phase difference signals QU(1:4) from the flip-flops 23_1 to 23_4 in the time-digital converter 20 as signals detecting a phase difference of ΔTf with an error less than the resolution with respect to the falling edge of the CKV in the time-digital converter 10, and handles the phase difference signals QD(1:4) from the flip-flops 24_1 to 24_4 as signals detecting a phase difference of ΔTr with an error less than the resolution with respect to the rising edge of the CKV. The logic circuit 2 corrects these phase differences, whereby high-resolution digital phase comparison is made possible without causing significant increase in circuit area or power consumption. Operation when a phase comparison in the time-digital converter 10 results in Tr<Tf is the same as the operation in the example of the second exemplary embodiment, and thus description thereof will be omitted.

In this example as well, like the second exemplary embodiment, high-resolution digital phase comparison can be realized without causing significant increase in circuit area or power consumption.

(Fourth Exemplary Embodiment)

Figure 19:
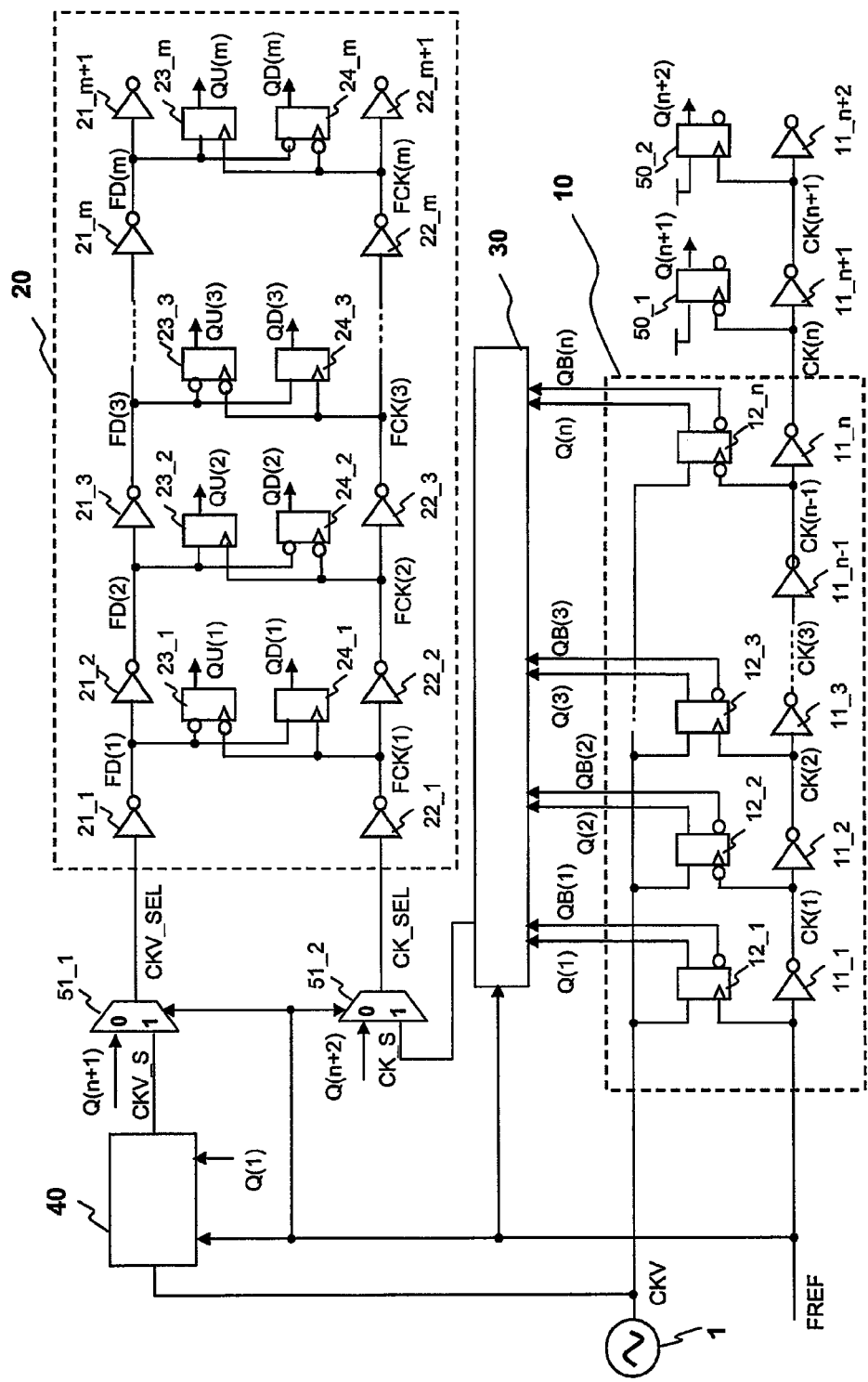
FIG. 19 is a diagram illustrating a configuration of a digital phase comparator according to a fourth exemplary embodiment of this invention.

FIG. 19 is a block diagram illustrating a digital phase comparator according to a fourth exemplary embodiment of this invention. Referring to FIG. 19, this digital phase comparator has a configuration in which an inverter array 11_n+1 and 11_n+2, flip-flops 50_1, 50_2, and selectors 51_1, 51_2 are added to the configuration of the second exemplary embodiment shown in FIG. 11. The inverter array 11_n+1 and 11_n+2 are set so as to have the same delay time as that of the inverter array 11_1 to 11_n in the time-digital converter 10.

The inverter array 11_n+1 and 11_n+2 are connected to the output of the inverter 11_n in the time-digital converter 10, and their output signals CK(n) and CK(n+1) are connected to clock input terminals of the flip-flop 50_1 and 50_2, respectively. The flip-flops 50_1 and 50_2 produce step signals Q(n+1) and Q(n+2), respectively, in synchronism with a transition timing of the CK(n) and CK(n+1) obtained by delaying the falling edge of the reference clock signal FREF. In FIG. 19, the flip-flop 12_n is an even-numbered flip flop whose clock input terminal is a negative logic. In order to match the logic of data to be latched by the flip flops 50 1 and 50 2, the flip-flop 50_1 receives a negative logic clock signal at its clock terminal and the flip-flop 50_2 receives a positive logic clock signal at its clock terminal.

In the selector 51_1, when the reference clock signal FREF is Low, an output Q(n+1) from the flip-flop 50_1 is supplied, as an output CKV_SEL, to the inverter 21_1 in the time-digital converter 20. Likewise, in the selector 51_2, when the reference clock signal FREF is Low, an output Q(n+2) from the flip-flop 50_2 is supplied as an output CK_SEL to the inverter 22_1 in the time-digital converter 20. These CKV_SEL and CK_SEL are step signals whose phases are deviated from each other by a delay time in the inverter array 11_1 to 11_n+2, and this phase difference is converted into a digital signal with a resolution of accuracy corresponding to the delay time difference between the inverter arrays 21_1 to 21_m+1 and 22_1 to 22_m+1.

When the reference clock signal FREF is High, the selector 51_1 produces the output CKV_S of the timing adjuster 40.

The selector 51_2 produces the pulse signal CK_S of the timing extractor 30. This is the same as in the second exemplary embodiment.

EXAMPLE 4

Figure 20:
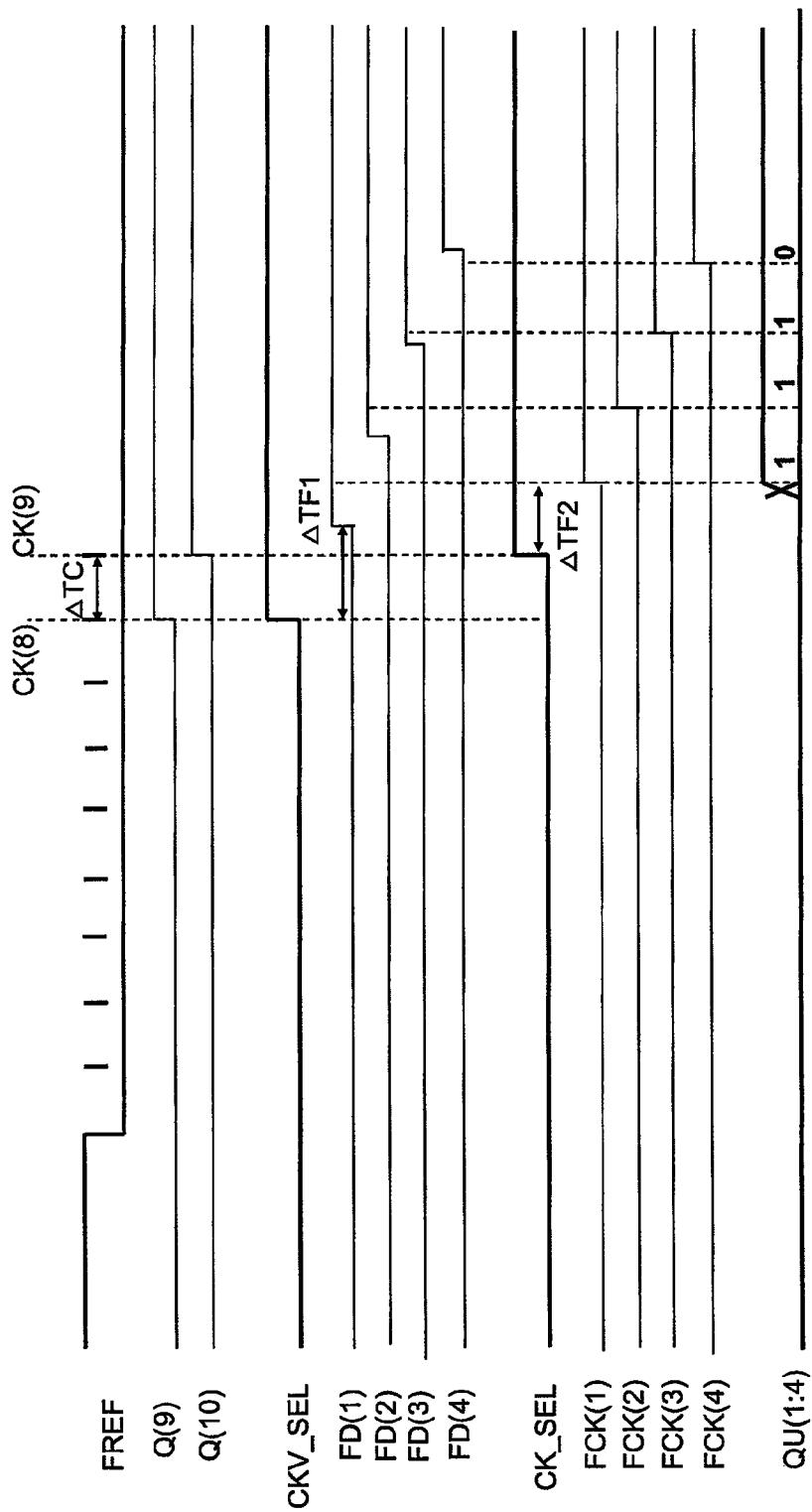
FIG. 20 is a timing chart for explaining an example of operation of a time-digital converter 20 of the digital phase comparator according to the fourth exemplary embodiment of this invention.

A specific example relating to this embodiment will be described with reference to the drawings. FIG. 20 is a timing chart relating to the time-digital converter 20 in which n=8, m=4, and the reference clock signal FREF is Low in the fourth exemplary embodiment shown in FIG. 19. Operation in a case where the reference clock signal FREF is High is the same as the operation of the digital phase comparator of the example in the second exemplary embodiment shown in FIGS. 13 and 14, and hence operation thereof will be omitted.

In the time-digital converter 20 of this example, the signal CKV_SEL in synchronism with the output signal CK(8) of the inverter 11_8 is produced by the selector 51_1, and sequentially delayed by the inverter array 21_1 to 21_4. The flip-flops 23_1 to 23_4 sequentially latch the sequentially delayed signals using, as clock signals, the signals FCK(1) to FCK(4) sequentially delayed the signal CK_SEL in synchronism with the output signal CK(9) of the inverter 11_9 by the inverter array 22_1 to 22_4.

The output CKV_SEL from the selector 51_1 and the output CK_SEL from the selector 51_2 are in a relationship in which the phase of the output CKV_SEL is advanced with respect to that of the output CK_SEL by a resolution ΔTc in the time-digital converter 10. In this case, the following relationship is established between a phase difference ΔTF1 of the inverters of the inverter array 21_1 to 21_4 and a phase difference ΔTF2 of the inverters of the inverter array 22_1 to 22_4:

$$\Delta TF1 > \Delta TF2.$$

Therefore, the phase difference is reduced by ΔTF1-ΔTF2 every time the signal passes through each inverter of the inverter array 22_1 to 22_4.

In FIG. 20, the phase of the data input FD(3) is advanced with respect to the clock input FCK(3) until the third flip-flop 23_3, and hence logic "1" is produced. However, the phase relationship is reversed once the signal has passed through the fourth inverter 21_4. Specifically, the phase of the FD(4) is retarded relative to that of the FCK(4). As a result, outputs from the fourth and onward flip-flops become logic "0", and a resolution ΔTc of the time-digital converter 10 can be represented as three times (three inverters) the delay difference ΔTF1-ΔTF2 of the inverter array. Thus, the following relationship is established:

$$\Delta Tc = 3(\Delta TF1 - \Delta TF2).$$

When it is assumed that the outputs of the time-digital converter 10 and the time-digital converter 20 are the same as in the example of the first exemplary embodiment, Tr=3ΔTc−ΔTr and Tf=7ΔTc−ΔTf can be represented as follows.

$$Tr = 3\Delta Tc - 2(\Delta TF1 - \Delta TF2)$$
$$= 3 \times 3(\Delta TF1 - \Delta TF2) - 2(\Delta TF1 - \Delta TF2)$$
$$= 7(\Delta TF1 - \Delta TF2)$$

$$Tf = 7\Delta Tc - 2(\Delta TF1 - \Delta TF2)$$
$$= 7 \times 3(\Delta TF1 - \Delta TF2) - 2(\Delta TF1 - \Delta TF2)$$
$$= 19(\Delta TF1 - \Delta TF2)$$

In this case, a phase difference 8 normalized with a VCO output signal cycle is represented as follows:

$$\epsilon = Tr/(|Tr - Tf| \times 2) = 7/24.$$

As described above, the phase difference between the VCO output signal CKV and the reference clock signal FREF can be normalized with the cycle of the VCO output signal CKV by measuring the resolution of the time-digital converter 10 in the time-digital converter 20 while the reference clock signal FREF is Low, and thus the phase difference can be represented without the need of finding an accurate delay time of the inverter arrays 11_1 to 11_n+2, 21_1 to 21_m+1, and 22_1 to 22_m+1. Further, although this exemplary embodiment is applied to the second exemplary embodiment, it can be applied to the first or third exemplary embodiment as well by adding the inverter arrays 11_n+1 and 11_n+2, and the flip-flops 50_1 and 50_2, and the selectors 51_1 and 51_2.

In this example, when the reference clock signal FREF is High, operation is the same as that of the digital phase comparator in the example of the second exemplary embodiment. Thus, like the second exemplary embodiment, high-resolution digital phase comparison can be realized without causing significant increase in circuit area or power consumption. When the reference clock signal FREF is Low, a phase difference between the VCO output signal CKV and the reference clock signal FREF can be normalized with a cycle of the VCO output signal CKV by measuring the resolution of the time-digital converter 10 in the time-digital converter 20. The phase difference can be represented without the need of finding an accurate delay time of the inverter arrays 11_1 to 11_n+2, 21_1 to 21_m+1, and 22_1 to 22$_{-m+}$1.

(Fifth Exemplary Embodiment)

Figure 21:
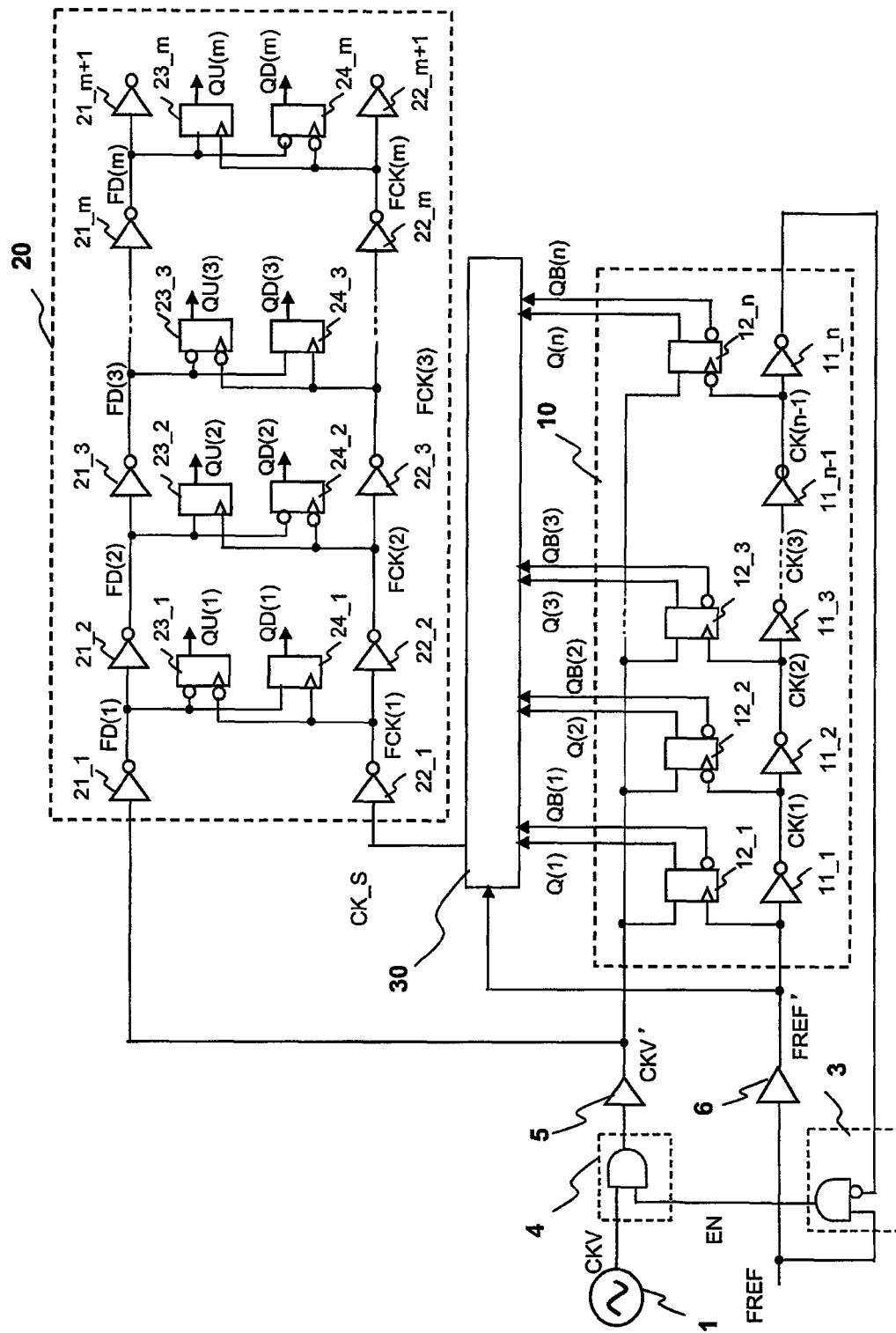
FIG. 21 is a diagram illustrating a configuration of a digital phase comparator according to a fifth exemplary embodiment of this invention.

FIG. 21 is a block diagram illustrating a digital phase comparator according to a fifth exemplary embodiment of this invention. Referring to FIG. 21, this digital phase comparator has a configuration in which there are added to the configuration of the first exemplary embodiment shown in FIG. 6, a control signal generator 3 which receives as inputs the reference signal FREF and the output from the inverter 11_n in the time-digital converter 10 to produce a control signal EN, a controller 4 for selecting by means of the control signal EN whether or not the VCO output signal CKV is to be passed or not, a buffer 5 arranged between the output of the controller 4 and the time-digital converter 10 and the time-digital converter 20, and a buffer 6 arranged between the reference clock signal FREF and the time-digital converter 10 and the timing extractor 30.

The control signal generator 3 is formed of a composite logic gate. The control signal EN becomes High when the reference signal FREF is High and the final stage 11$_{-n}$ of the inverter array in the time-digital converter 10 is Low. The controller 4 is formed of an AND gate, and allows the VCO output signal CKV to pass only when the control signal EN is High. When the control signal EN is Low, the controller stops operation and its output becomes Low.

EXAMPLE 5

Figure 22:
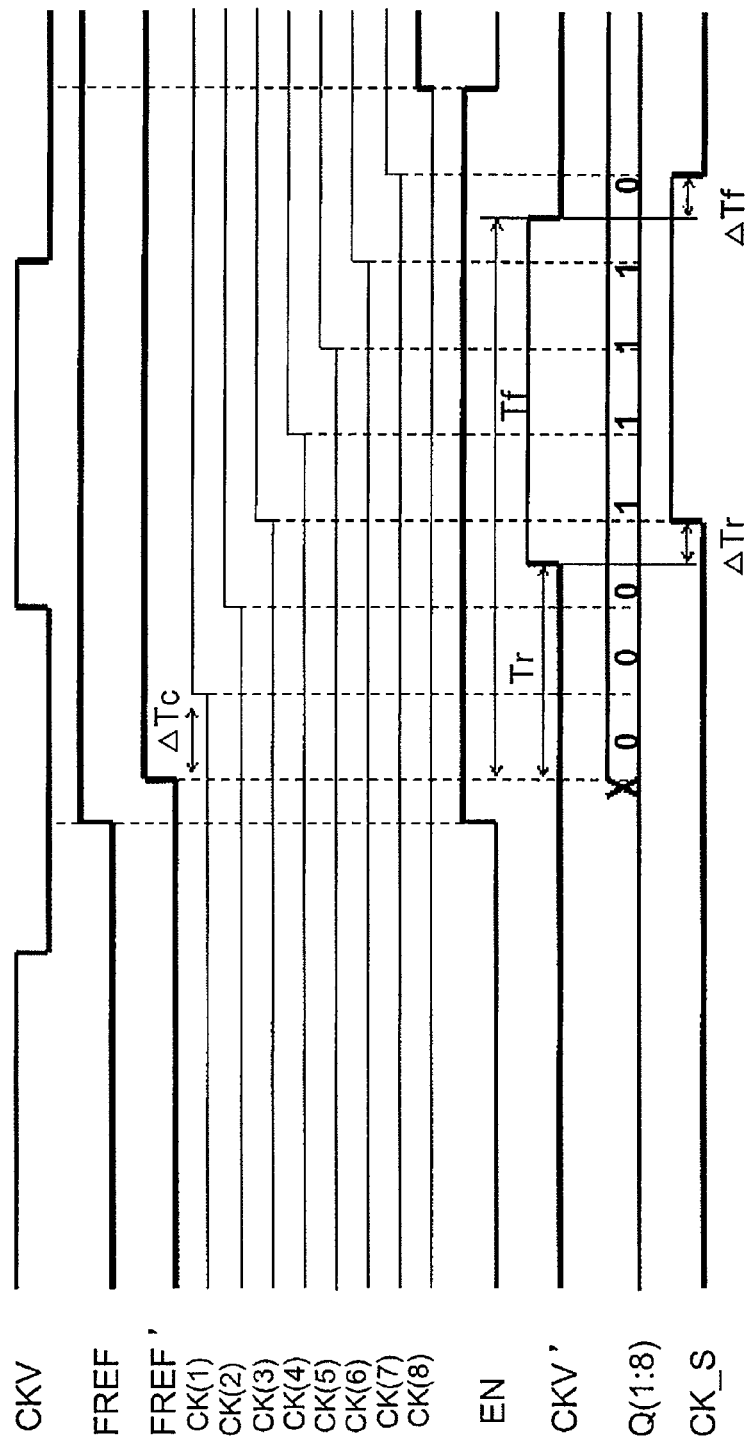
FIG. 22 is a timing chart for explaining an example of operation of a time-digital converter 10 of the digital phase comparator according to the fifth exemplary embodiment of this invention.

A specific example relating to the fifth exemplary embodiment of the invention will be described in detail with reference to the drawings. FIG. 22 is a timing chart relating to the control signal generator 3, the controller 4, the buffers 5, 6, and the time-digital converter 10 when n=8 in the fifth exemplary embodiment shown in FIG. 21. Operation of the time-digital converter 20 and the timing extractor 30 is the same as that of the digital phase comparator described in the example of the first exemplary embodiment shown in FIGS. 9 to 10.

However, the VCO output signal CKV and the reference clock signal FREF are changed, respectively, to output signals CKV' and FREF' of the buffers 5 and 6.

Referring to FIG. 22, the reference signal FREF is sequentially delayed by the buffer 6 and the inverter array 11_1 to 11_8 in the time-digital converter 10 to be produced thereafter. The control signal EN that is an output from the control signal generator 3 is High only during the period from rising of the reference signal FREF until rising of the output from the inverter 11_8, whereas during the other period, Low is produced. In the controller 4, the VCO output signal CKV is allowed to pass only during a period when the control signal EN is High, and its output signal CKV' is supplied to the time-digital converter 10 and the time-digital converter 20 via the buffer 5. During a period when the control signal EN is Low, the controller 4 stops its operation.

A phase comparison is performed by the time-digital converter 10, using the output signal CKV' from the buffer 5 and the output signal FREF' from the buffer 6 obtained in the manner which is described above. The time-digital converter 20 performs a phase comparison, using the CKV' and the pulse signal CK_S obtained by the timing extractor 30. Since the CKV' is a signal which is stopped except during the period from when the reference signal FREF' is supplied in the time-digital converter 10 until when it is passed through the inverter 11_8, that is, except during the period when the phase comparison is performed. Therefore, operation of the inverter array 21_1 to 21_m in the time-digital converter 20 and the buffer 5 can be stopped while no phase comparison is performed, and thus power consumption can be reduced.

According to this example as well, like the first exemplary embodiment, high-resolution digital phase comparison can be realized without causing significant increase in circuit area or power consumption. Further, the controller 4 in this example produces the signal only during the period from when the reference clock signal FREF is supplied until when the signal is passed through the final-stage inverter 11_8 in the time-digital converter 10, and thus operation of the inverter array 21_1 to 21_m in the time-digital converter 20 can be stopped during the period when no phase comparison is performed. This makes it possible to reduce the power consumption further than the case of the digital phase comparator according to the first exemplary embodiment. Even if the buffer 5 for driving the data terminals of the flip-flops 12_1 to 12_8 in the time-digital converter 10 requires large power consumption, operation of the buffer can be stopped during the period when it is not required, and hence the power consumption can be reduced. Although this exemplary embodiment is applied to the first exemplary embodiment here, it can be applied to the second and fourth exemplary embodiments as well by adding the control signal generator 3, the controller 4, and the buffers 5 and 6.

(Sixth Exemplary Embodiment)

Figure 23:
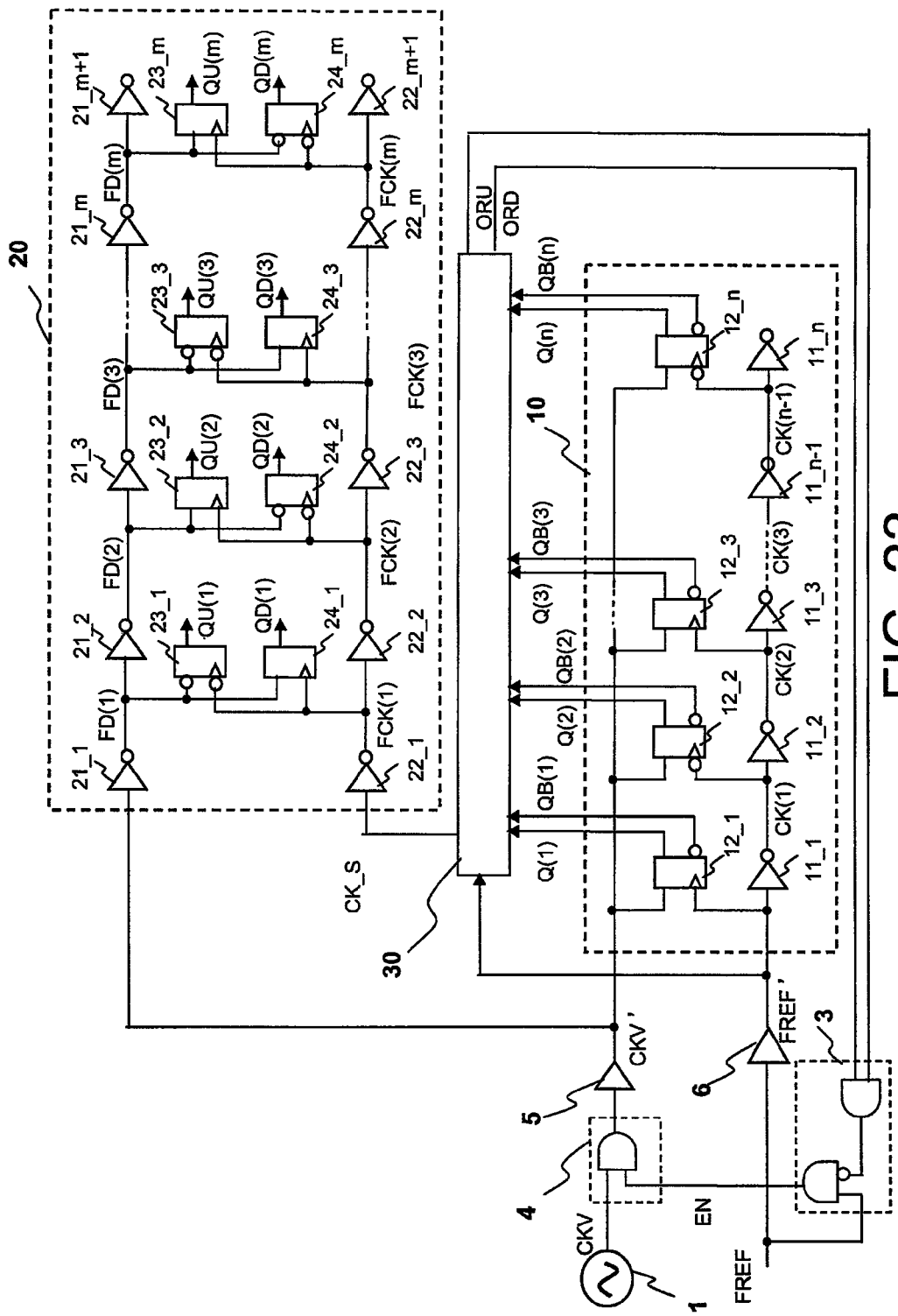
FIG. 23 is a diagram illustrating a configuration of a digital phase comparator according to a sixth exemplary embodiment of this invention.

FIG. 23 is a block diagram illustrating a digital phase comparator according to a sixth embodiment of this invention. Referring to FIG. 23, this digital phase comparator has the configuration as that of the fifth exemplary embodiment shown in FIG. 21 except that the reference signal FREF and the outputs ORU and ORD from the OR gates 33 and 34 in the timing extractor 30 are supplied to the control signal generator 3.

The control signal generator 3 is formed of an AND gate and a composite logic gate, and its output EN becomes High during the period from when the reference signal FREF becomes High until both the step signals ORU and ORD becomes High in the timing extractor 30. The step signals ORU and ORD are signals in synchronism with the timing of transition immediately after the rising and falling of the CKV among the signals CK(1) to CK(n) obtained by sequentially delaying the reference signal FREF by the inverter array 11_1 to 11_n.

EXAMPLE 6

Figure 24:
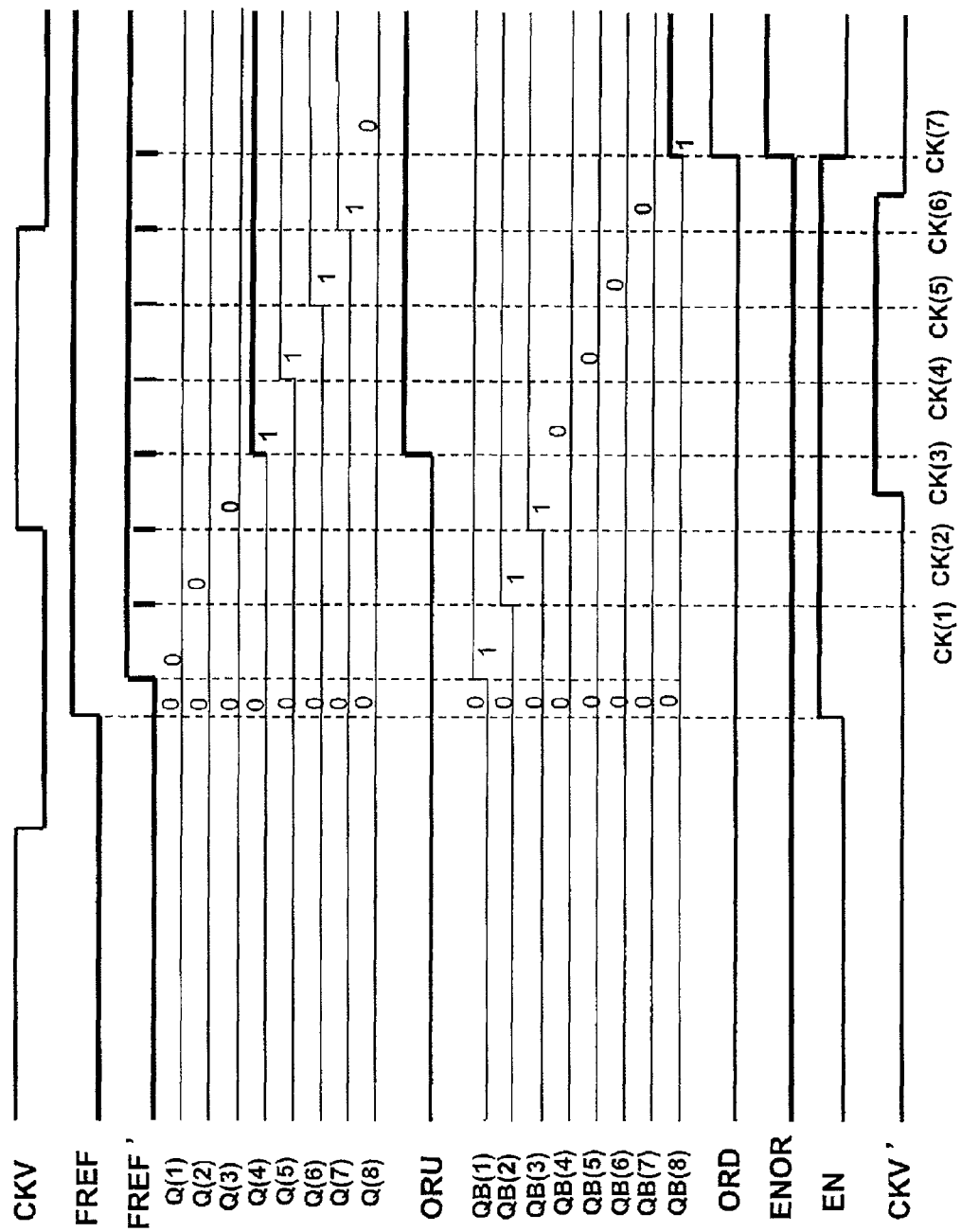
FIG. 24 is a timing chart for explaining an example of operation of a timing extractor 30 of the digital phase comparator according to the sixth exemplary embodiment of this invention.

A specific example of this exemplary embodiment of the invention will be described in detail with reference to the drawings. FIG. 24 is a timing chart relating to the control signal generator 3, the controller 4, the buffers 5, 6, and the timing extractor 30 when n=8 in the sixth exemplary embodiment of FIG. 23. Operation of the time-digital converter 10 and the time-digital converter 20 is the same as that of the digital phase comparator of the example of the first exemplary embodiment shown in FIGS. 8 and 10, and thus description thereof will be omitted. However, it is assumed that the VCO output signal CKV and the reference clock signal FREF are respectively changed to the output signals CKV' and FREF' of the buffers 5 and 6.

Referring to FIG. 24, the reference signal FREF is sequentially delayed by the buffer 6 and the inverter array 11_1 to 11_8 in the time-digital converter 10 to be produced thereafter. The ORU is a step signal which becomes High at the timing when the signal CK(3) rises, and the ORD is a step signal which becomes High at the timing when the signal CK(7) rises. Therefore, the control signal EN that is output from the control signal generator 3 is High during a period from the rising of the reference signal FREF until the transition timing of the CK(7) at which the ORD becomes High, whereas the control signal EN is Low during the other period. The VCO output signal CKV passes through the controller 4 only during the period when the control signal EN is High, and an output signal CKV' thereof is supplied to the time-digital converter 10 and the time-digital converter 20 via the buffer 5. This means that the controller 4 allows the VCO output CKV to pass through only during the period from when the reference signal FREF rises and phase comparison is started in the time-digital converter 10 until when a comparison is performed for both the rising and falling edges of the CKV in the time-digital converter 10, and operation is stopped during the other period.

The time-digital converter 10 performs a phase comparison, using the output signal CKV' from the buffer 5 and the output signal FREF' from the buffer 6 obtained in the manner which is described above. The time-digital converter 20 performs a phase comparison, using the CKV' and the pulse signal CK_S obtained by the timing extractor 30. Since operation of controller 4 is stopped immediately once the rising and falling edges of the CKV' are detected by the control signal EN in the time-digital converter 10, power consumption can be reduced further in comparison with the digital phase comparator according to the fifth exemplary embodiment.

In this example as well, like the first exemplary embodiment, high-resolution digital phase comparison can be realized without causing significant increase in circuit area or power consumption. Furthermore, the output of the controller 4 of this example is stopped immediately once the rising and falling edges of the CKV' supplied in the time-digital converter 10 are detected after the reference clock signal FREF is supplied. Therefore, operation of the inverter array 21_1 to 21_m in the time-digital converter 20 can be stopped during an unnecessary period, whereby the power consumption can be reduced further than the case of the digital phase comparator according to the fifth exemplary embodiment. In addition, even if the buffer 5 consumes much power for driving the data terminals of the flip-flops 12_1 to 12_8 in the time-digital converter 10, the operation can be stopped during a period when it is not necessary, whereby the power consumption can be reduced. Although this exemplary embodiment is applied to the first exemplary embodiment here, it can also be applied to the second, third, and fourth exemplary embodiments by adding the control signal generator 3, the controller 4, and the buffers 5 and 6.

According to this invention as described above, a digital phase comparator is provided, which includes: a first circuit unit having a first delay element array in which a plurality of delay elements are connected in series to delay a first clock signal at regular intervals, and a first group of data holding circuits for sampling a second clock signal respectively with the first clock signal and a first group of delayed signals obtained by delaying the first clock signal with the first delay element array; a second circuit unit for generating a first signal by performing a predetermined logic operation on a plurality of signals sampled by the first group of data holding circuits; and a third circuit unit having a second delay element array for receiving the second clock signal and the first signal and for delaying the second clock signal at regular intervals, and a third delay element array for delaying the first signal at regular intervals by a different delay time from that for the second clock signal, the third circuit unit further having a second group of data holding circuits for sampling the second group of delayed signals delayed by the second delay element array with a third group of delayed signals delayed by the third delay element array. In this digital phase comparator, the signals sampled in the first group of data holding circuits and the signals sampled in third group of data holding circuits are used as values corresponding to a phase difference between the first clock signal and the second clock signal. The second circuit unit is able to produce the first signal in synchronism with a delayed signal in the first group of delayed signals that is produced immediately after the transition of the second clock signal.

Further, according to this invention, accuracy of time resolution in the third circuit unit is equal to a delay time difference between the second delay element array and the third delay element array. Therefore, it is made possible to compare minute phase differences less than the delay time accuracy by the first delay element array in the first circuit unit. A relative phase difference between the second clock signal supplied to the third circuit unit and the first signal corresponds to the comparison error less than the delay time of the first delay element array in the first circuit unit, and this phase difference is sufficiently small than the relative phase difference between the first clock signal and the second clock signal. Accordingly, highly accurate phase comparison is made possible without increase the number of elements in the second and third delay element arrays in the third circuit unit or the number of circuits in the second group of holding circuits. Thus it is made possible to provide a high-resolution digital phase comparator without cause increase in circuit area or power consumption.

In the digital phase comparator according to this invention, the second circuit unit produces the first signal in the first group of delayed signals that rises in synchronism with a delayed signal produced immediately after the rising of the second clock signal, and that falls in synchronism with a delayed signal produced immediately after the falling of the second clock signal. The third circuit unit further has a third data holding circuit group. In the third circuit unit, the second group of data holding circuits samples the second group of delayed signals at the rising edges of the third group of delayed signals, and the third group of data holding circuits samples the second group of delayed signals at the falling edges of the third group of delayed signals. By using the sampled results in the third circuit unit, it is possible to correct the phase difference between the first clock signal and the second clock signal that is obtained by the sampled results in the first circuit unit.

According to the invention, a digital phase comparator can be provided which is capable of highly accurate phase comparison both for rising and falling edges of the second clock signal by correcting the results of the phase comparison in the first circuit unit with the use of sampled results in the second and third groups of data holding circuits in the third circuit unit.

The digital phase comparator according to this invention further has a fourth circuit unit for generating a second signal by performing a predetermined logic operation on the second clock signal. Thus the second signal in place of the second clock signal is supplied to the third circuit unit. In the second circuit unit, the setting may be such that a delay time in the second circuit unit from when a delayed signal in the first group of delayed signals that is produced immediately after the transition of the second clock signal is supplied until when the first signal is produced is equal to a delay time in the fourth circuit unit from when the second clock signal is supplied until when the second signal is produced.

According to this invention, even if a delay time in the second circuit unit is at an unnegligible level with respect to the time resolution in the first and third circuit units, a phase comparison can be performed in the third circuit unit while keeping a phase difference corresponding to a comparison error between the second clock signal and a delayed signal in the first group of delayed signals that is produced immediately after the transition of the second clock signal.

In the digital phase comparator according to this invention, the second signal can be such a signal that rises in synchronism with the rising edge of the second clock signal immediately after the rising of the first clock signal and that falls in synchronism with the falling edge of the second clock signal immediately after the rising of the first clock signal. The second signal supplied to the second delay element array does not transit except for the period when phase comparison is performed in the third circuit unit, and hence power consumption in the second delay element array can be reduced.

The first signal in the digital phase comparator of this invention can be generated by performing an exclusive OR operation on a first step signal which rises in synchronism with a delayed signal in the first group of delayed signals that is produced immediately after the rising of the second clock signal and on a second step signal which rises in synchronism with a delayed signal in the first group of delayed signals that is produced immediately after the falling of the second clock signal. Further, the second signal is generated by performing an exclusive OR operation on a step signal which rises in synchronism with the rising of the second clock signal and on a step signal which rises in synchronism with the falling of second clock signal.

The digital phase comparator of this invention includes: a first data holding circuit for generating a third step signal in synchronism with the falling edge of a delayed signal which is any one selected from the first group of delayed signals; a second data holding circuit for generating a fourth step signal in synchronism with the falling edge of a signal obtained by delaying the delayed signal; a first selector circuit for selecting one of the first signal and the fourth step signal according to whether the first clock signal is High or Low; and a second selector circuit for selecting one of the second clock signal or the second signal and the third step signal according to whether the first clock sigma is High or Low. When the first clock signal is Low, the third and fourth step signals are selected as inputs of the third circuit unit, and sampled results in the third circuit unit are used as a value corresponding to the delay time of the delay elements in the first delay element array. Sampled results obtained in the third circuit unit when the first clock signal is High and sampled results obtained in the third circuit unit when first clock signal is Low can be used in order to correct the phase difference between the first clock signal and the second clock signal obtained by the sampled results in the first circuit unit.

Further, a time resolution of the first circuit unit can be represented by a time resolution of the third circuit unit, and a phase difference between the first clock signal and the second clock signal can be represented as a value based on the time resolution of the third circuit unit.

The digital phase comparator of this invention is capable of normalizing the phase difference between the first clock signal and the second clock signal with one cycle of the second clock signal by using results sampled in the first circuit unit, results sampled in the third circuit unit during the period when the first clock signal is High, and results sampled in the third circuit unit during the period when the first clock signal is Low. According to this invention, since the normalization is performed according to one cycle of the second clock signal, it is not required to use correct values for delay times in the first to third delay element arrays. This provides an advantage that the design accuracy required for the delay time can be reduced.

The digital phase comparator of this invention further includes a fifth circuit unit for generating a control signal by performing a predetermined logic operation on the first clock signal and a final delayed signal of the first group of delayed signals, so that it can be controlled by the control signal whether the second clock signal is allowed to pass or stopped. The digital phase comparator of this invention further includes a sixth circuit unit for generating a control signal by performing a predetermined logic operation on the first clock signal, the first step signal, and the second step signal, so that it can be controlled by the control signal whether the second clock signal is allowed to pass or stopped.

While this invention has been particularly shown and described with reference to exemplary embodiments and illustrative examples thereof, the invention is not limited to the foregoing embodiments and examples. It will be understood by those of ordinary skilled in the art that various changes in form and details may be made therein without departing from the sprit and scope of the present invention as defined by the claims.

This application is based upon and claims the benefit of priority from Japanese Patent Application No. 2009-056886, filed Mar. 10, 2009, and Japanese Patent Application No. 2009-190425, filed Aug. 19, 2009, the disclosures of which are incorporated herein in their entirety by reference.

The invention claimed is:

1. A digital phase comparator comprising:
a first circuit unit including a first delay element array delaying a first clock signal at regular intervals, and a first group of data holding circuits generating and producing first phase difference signals obtained by sampling a second clock signal with the use of the first clock signal and a first group of delayed signals obtained by delaying the first clock signal with the first delay element array;
a second circuit unit generating a first signal by performing a logic operation on the first phase difference signals; and
a third circuit unit including a second delay element array delaying the second clock signal at first regular intervals, and a third delay element array delaying the first signal at second regular intervals, and further including a second group of data holding circuits generating and producing second phase difference signals obtained by sampling a second group of delayed signals obtained by delaying the second clock signal with the second delay element array, with the uses of a third group of delayed signals obtained by delaying the first signal with the third delay element array,
wherein the first phase difference signals and the second phase difference signals are digital phase difference information indicating a phase difference between the first clock signal and the second clock signal.

2. The digital phase comparator as claimed in claim 1, wherein the first signal is a signal in synchronism with a delayed signal in the first group of delayed signals, that is produced immediately after the transition of the second clock signal.

3. The digital phase comparator as claimed in claim 1, wherein the first signal is a signal which rises in synchronism with a delayed signal in the first group of delayed signals, that is produced immediately after the rising of the second clock signal, and which falls in synchronism with a delayed signal in the first group of delayed signals, that is produced immediately after the falling of the second clock signal.

4. The digital phase comparator as claimed in claim 1, wherein the third circuit unit further includes a third group of data holding circuits, and, in the third circuit unit, the second group of data holding circuits produce second phase difference signals for the rising edge obtained by sampling the second group of delayed signals at the rising edges of the third group of delayed signals, and the third group of data holding circuits produce second phase difference signals for the falling edge obtained by sampling the second group of delayed signals at the falling edges of the third group of delayed signals.

5. The digital phase comparator as claimed in claim 4, wherein the second phase difference signals sampled in the third circuit unit are used for further correcting the phase difference between the first clock signal and the second clock signal that has been corrected with the first phase difference signals sampled in the first circuit unit.

6. The digital phase comparator as claimed in claim 1, further comprising a fourth circuit unit generating a second signal by performing a predetermined logic operation on the second clock signal, the second signal being supplied to the third circuit unit in place of the second clock signal.

7. The digital phase comparator as claimed in claim 6, wherein the setting is such that a delay time from when a delayed signal in the first group of delayed signals, that is produced immediately after the transition of the second clock signal, is supplied until when the first signal is produced in the second circuit unit is equal to a delay time from when the second clock signal is supplied until when the second signal is produced in the fourth circuit unit.

8. The digital phase comparator as claimed in claim 6, wherein the second signal rises in synchronism with the rising edge of the second clock signal immediately after the rising of the first clock signal, and falls in synchronism with the falling edge of the second clock signal immediately after the rising of the first clock signal.

9. The digital phase comparator as claimed in claim 6, wherein:
the first signal is a signal generated by performing an exclusive OR operation on a first step signal which rises in synchronism with a delayed signal in the first group of delayed signals, that is produced immediately after the rising of the second clock signal, and a second step signal which rises in synchronism with a delayed signal in the first group of delayed signals, that is produced immediately after the falling of the second clock signal; and the second signal is a signal generated by performing an exclusive OR operation on a step signal which rises in synchronism with the rising of the second clock signal, and a step signal which rises in synchronism with the falling of the second clock signal.

10. The digital phase comparator as claimed in claim 9, comprising a sixth circuit unit generating a control signal by performing a predetermined logic operation on the first clock signal, the first step signal, and the second step signal, the control signal being used to control whether the second clock signal is allowed to pass or stopped.

11. The digital phase comparator as claimed in claim 6, comprising:
a first data holding circuit generating a third step signal in synchronism with the falling edge of a delayed signal which is any one selected from the first group of delayed signals;
a second data holding circuit generating a fourth step signal in synchronism with the falling edge of a signal obtained by delaying the delayed signal;
a first selector circuit selecting one of the first signal and the fourth step signal according to whether the first clock signal is at a high level or a low level; and
a second selector circuit selecting either the second clock signal or the second signal, or the third step signal according to whether the first clock signal is at high level or a low level,
wherein, when the first clock signal is at a low level, the third and fourth step signals are selected as inputs of the third circuit unit, and sampled results in the third circuit unit are used as a value corresponding to the delay time of delay elements in the first delay element array.

12. The digital phase comparator as claimed in claim 11, wherein in the third circuit unit, the second phase difference signals sampled during a period when the first clock signal is at a high level or a low level are used to further correct a phase difference between the first clock signal and the second clock signal that has been corrected with first phase difference signals sampled in the first circuit unit .

13. The digital phase comparator as claimed in claim 11, wherein a phase difference between the first clock signal and the second clock signal is normalized with one cycle of the second clock signal with the use of the first phase difference signals sampled in the first circuit unit and the second phase difference signals sampled in the third circuit unit during periods when the first clock signal is at a high level and a low level.

14. The digital phase comparator as claimed in claim 11, wherein the data holding circuits in the first to third groups of data holding circuits, and the first and second data holding circuits are flip-flops.

15. The digital phase comparator as claimed in claim 1, wherein the delay elements of the first to third delay element arrays are inverters.

16. The digital phase comparator as claimed in claim 1, comprising a fifth circuit unit generating a control signal by performing a predetermined logic operation on the first clock signal and a final delayed signal in the first group of delayed signals, the control signal being used to control whether the second clock signal is allowed to pass or stopped.

17. A method of detecting a phase difference in a digital phase comparator, comprising:
sampling a second clock signal with the use of a first group of clock signals obtained by delaying a first clock signal at regular intervals and the first clock signal, and holding the sampled signals as first phase difference signals in a first group of data holding circuits;
generating a first signal by performing a logic operation on the first phase difference signals;
delaying the second clock signal and the first signal by different delay times from each other at regular intervals, respectively, sampling a second group of clock signals obtained by delaying the second clock signal at the regular intervals with a first group of signals obtained by delaying the first signal at the regular intervals, and holding the sampled signals as second phase difference signals in a second group of data holding circuits.

18. The method as claimed in claim 17, wherein producing, as the first signal, a signal in the first group of clock signals or the first clock signal, that is synchronous with a delayed signal produced immediately after the transition of the second clock signal.

19. The method as claimed in claim 17, wherein producing, as the first signal, a signal in the first group of clock signals or the first clock signal, that rises in synchronism with a delayed signal produced immediately after the rising of the second clock signal, and that falls in synchronism with a delayed signal produced immediately after the falling of the second clock signal.

20. The method as claimed in claim 17, wherein the holding in the second group of data holding circuits generates second phase difference signals for the rising edges obtained by sampling the second group of clock signals delayed at the regular intervals at the rising edges of the first group of signals delayed at the regular intervals, and second phase difference signals for the falling edges obtained by sampling the second group of clock signals at the falling edges of the group of first signals.

* * * * *